United States Patent
Moon et al.

(10) Patent No.: US 8,779,425 B2
(45) Date of Patent: Jul. 15, 2014

(54) LIGHT EMITTING DEVICE, LIGHT EMITTING DEVICE PACKAGE, AND LIGHTING SYSTEM INCLUDING THE SAME

(71) Applicants: Yong Tae Moon, Seoul (KR); Jeong Sik Lee, Seoul (KR); Dae Seob Han, Seoul (KR)

(72) Inventors: Yong Tae Moon, Seoul (KR); Jeong Sik Lee, Seoul (KR); Dae Seob Han, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/850,344

(22) Filed: Mar. 26, 2013

(65) Prior Publication Data

US 2013/0228746 A1    Sep. 5, 2013

Related U.S. Application Data

(63) Continuation of application No. 13/177,766, filed on Jul. 7, 2011, now Pat. No. 8,421,075.

(30) Foreign Application Priority Data

Jul. 9, 2010    (KR) .......... 10-2010-0066396
Jul. 14, 2010    (KR) .......... 10-2010-0068122
Aug. 10, 2010    (KR) .......... 10-2010-0076758

(51) Int. Cl.
  *H01L 29/04*    (2006.01)
  *H01L 21/00*    (2006.01)

(52) U.S. Cl.
  USPC .............................. 257/54; 438/23

(58) Field of Classification Search
  USPC .......... 257/17, 35, 54, 86, E33.056–E33.059; 438/23, 57
  See application file for complete search history.

(56) References Cited

U.S. PATENT DOCUMENTS 5,473,173 A    12/1995    Takiguchi et al.
8,421,075 B2 *    4/2013    Moon et al. ............... 257/54

FOREIGN PATENT DOCUMENTS

| DE | 10 2007 044439 A1 | 3/2009 | |
|---|---|---|---|
| EP | 2 144 306 A1 | 1/2010 | |
| JP | S62 45089 A | 2/1987 | |
| JP | 2001-196701 A | 7/2001 | |
| JP | 2002-368268 A | 12/2002 | |
| KR | 10-1999-0056735 A * | 2/1999 | H01S 5/30 |
| KR | 10-1999-0056735 A | 7/1999 | |
| KR | 10-0809215 B1 | 2/2008 | |
| KR | 10-0826422 B1 | 4/2008 | |

OTHER PUBLICATIONS

Korean Office Action issued in KR Application No. 10-2010-0066396 dated May 4, 2011.
Korean Notice of Allowance issued in KR Application No. 10-2010-0066396 dated Jul. 25, 2011.
European Search Report dated Dec. 20, 2013 for corresponding Application No. 11175397.6.

* cited by examiner

*Primary Examiner* — Calvin Lee
(74) *Attorney, Agent, or Firm* — KED & Associates LLP

(57) ABSTRACT

A light emitting device, a light emitting device package, and a lighting system are provided. The light emitting device includes a first conductive type semiconductor layer, a second conductive type semiconductor layer, and an active layer between the first and second conductive type semiconductor layers. The active layer includes a first active layer adjacent to the second conductive type semiconductor layer, a second active layer adjacent to the first conductive type semiconductor layer, and a gate quantum barrier between the first and second active layers.

19 Claims, 12 Drawing Sheets ic # LIGHT EMITTING DEVICE, LIGHT EMITTING DEVICE PACKAGE, AND LIGHTING SYSTEM INCLUDING THE SAME

CROSS-REFERENCE TO RELATED APPLICATIONS

This application is a Continuation Application of U.S. patent application Ser. No. 13/177,766 filed on Jul. 7, 2011, now U.S. Pat. No. 8,421,075 issued Apr. 16, 2013 which claims under 35 U.S.C. §119 to Korean Patent Application No. 10-2010-0066396(filed Jul 9, 2010), 10-2010-0068122 (filed Jul. 14, 2010) and 10-2010-0076758(filed Aug. 10, 2010), which are hereby incorporated by references in their entireties.

BACKGROUND

The present disclosure relates to a light emitting device, a light emitting device package, and a lighting system.

Light emitting devices based on a nitride semiconductor thin film convert electric energy into light energy. With the development of thin-film growth techniques and light emitting materials, light emitting devices, using a nitride semiconductor material which is formed by combining the group III element and group V element of the periodic table, emit white light having various wavelengths (colors) such as red, green, blue, and ultraviolet light, and realize high efficient white light by using fluorescent materials or combining colors. Moreover, light emitting devices based on a nitride semiconductor thin film have low power consumption, semipermanent life, fast response time, stability, and environmental friendliness compared to the existing light sources such as fluorescent lamps and incandescent lamps. Therefore, the application of light emitting devices are being expanded to Light Emitting Diode (LED) backlights that replace Cold Cathode Fluorescent Lamps (CCFLs) configuring the backlight unit of a Liquid Crystal Display (LCD) device, white LED lighting devices for replacing fluorescent lamps or incandescent bulbs, the head lights of vehicles, traffic lights, etc. In expanding the application of nitride semiconductor light emitting devices, technology for developing high efficient light emitting devices is fundamentally required.

Nitride semiconductor light emitting devices of the related art have a limitation in that light emission efficiency is reduced due to a serious nonradiative recombination loss process when a high current is injected. The cause is not clearly established, and many global scholars and experts are actively researching for finding the cause. Also, nitride semiconductor light emitting devices of the related art have a limitation in that light emission efficiency is reduced by a nonradiative recombination loss process due to a crystal defect when a low current is injected.

In nitride semiconductor light emitting devices emitting blue light and green light, the reduction in light emission efficiency that is caused when injecting a high current is one of urgent technical limitations in implementing light emitting devices for high output and high efficient lighting.

Consequently, it is acutely being required to develop ideal nitride semiconductor light emitting device structures that provide excellent light emitting quantum efficiency in all injection current regions ranging from a region having the low amount of injection current to a region having the high amount of injection current.

SUMMARY

Embodiments provide a light emitting device, a light emitting device package, and a lighting system, which innovatively solve the limitations of the related art nitride semiconductor light emitting devices such as the reduction in light emission efficiency due to nonradiative recombination loss in injecting a high current and the reduction in light emission efficiency that is caused by nonradiative recombination loss due to a crystal defect in injecting a low current, thereby realizing high efficient light emission characteristics in all injection current regions.

In one embodiment, a light emitting device includes: a first conductive type semiconductor layer; a second conductive type semiconductor layer; and an active layer between the first and second conductive type semiconductor layers, wherein the active layer includes: a first active layer adjacent to the second conductive type semiconductor layer; a second active layer adjacent to the first conductive type semiconductor layer; and a gate quantum barrier between the first and second active layers.

In another embodiment, a light emitting device includes: a first conductive type semiconductor layer; a second conductive type semiconductor layer; and an active layer between the first and second conductive type semiconductor layers, wherein the active layer includes: a third active layer of a multiple-quantum well structure adjacent to the first conductive type semiconductor layer; a fourth active layer of a single quantum well structure adjacent to the second conductive type semiconductor layer; and a gate quantum barrier between the third and fourth active layers.

In further another embodiment, a light emitting device package includes the light emitting device; a package body in which the light emitting device is disposed; and one or more electrodes electrically connected the light emitting device and the package body.

In still further another embodiment, a lighting system includes a light emitting unit including the light emitting device package.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings.

Hereinafter, a light emitting device, a light emitting device package, and a lighting system, according to embodiments, will be described in detail with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Figure 1:
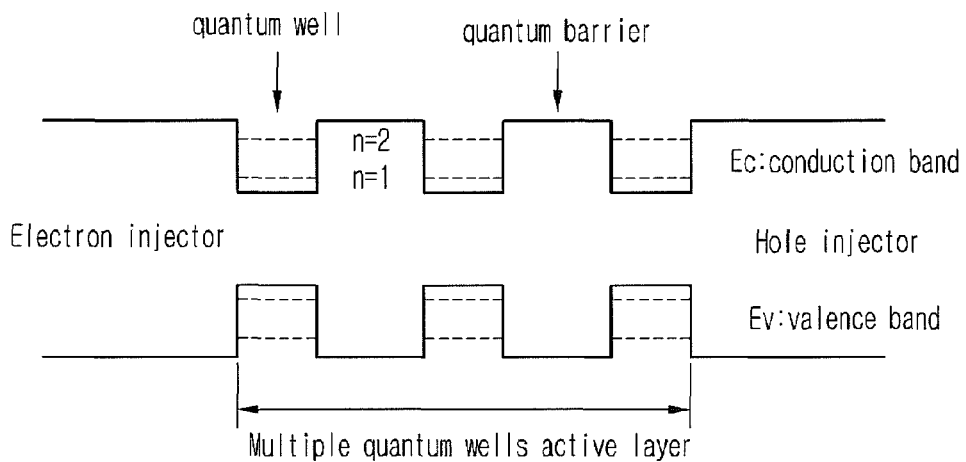
FIG. 1 is a view schematically illustrating an active layer energy band of a related art nitride semiconductor light emitting device including a multiple-quantum well structure active layer.
Figure 2:
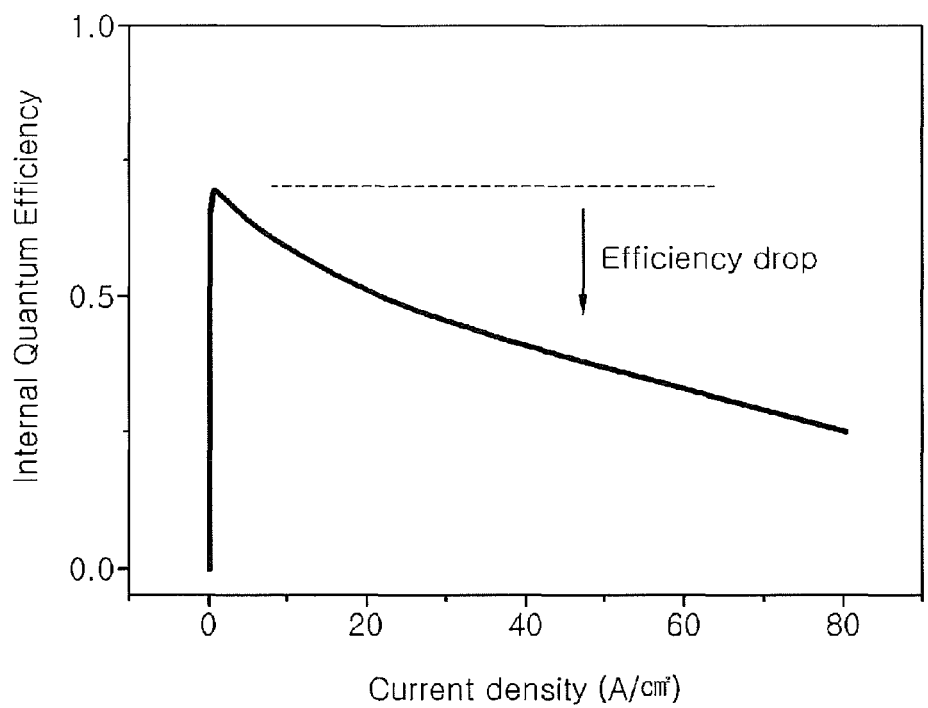
FIG. 2 is a characteristic view showing internal light emission quantum efficiency based on the increase in the injected current amount of a related art nitride semiconductor light emitting device including a multiple-quantum well structure active layer (see FIG. 1).

FIG. 1 is a view schematically illustrating an active layer energy band of a related art nitride semiconductor light emitting device including a multiple-quantum well structure active layer. FIG. 2 is a characteristic view showing internal light emission quantum efficiency based on the increase in the injected current amount of a related art nitride semiconductor light emitting device including a multiple-quantum well structure active layer (see FIG. 1).

As shown in FIG. 2, a technology of manufacturing a related art nitride semiconductor light emitting device based on a multiple-quantum well structure has a limitation in that light emission quantum efficiency is significantly reduced in inverse proportion to the increase in an injected current. In a nitride semiconductor multiple-quantum well structure active layer of the related art, electrons injected from an N-type GaN-based electron injection layer are disposed at quantized energy levels that are formed on a quantum well conduction band (Ec), and holes injected from an P-type GaN-based hole injection layer are disposed at quantized energy levels that are formed under a quantum well valence band (Ev). Electrons and holes disposed at ground state quantized energy levels in a quantum well are combined to emit light when a quantum-mechanical combination condition is satisfied.

A ground state (quantum number, n=1) quantized energy level having the lowest energy state in one quantum well may quantum-mechanically retain only a certain amount of electrons or holes. An electron and a hole disposed at a higher quantized energy level (higher quantum number of quantized energy level) are higher than an electron and a hole disposed at an energy state of a ground state. Therefore, when the number of injected electrons or holes is sufficient, carriers (electrons and holes) disposed at a high quantized energy level in one quantum well move to a ground state in another adjacent quantum well and participate in light emission.

In a related art nitride semiconductor light emitting device including a multiple-quantum well structure active layer (light emission layer), however, all quantum well layers in an active layer cannot conformally distribute or accommodate a plurality of injected carriers, and only a small number of quantum well layers adjacent to a hole injection layer participate in light emission. Therefore, when the amount of injected current is sufficient, surplus electrons and holes that are not effectively confined are generated inside an active layer.

The surplus electrons or holes do not participate in light emission, and are self vanished in the active layer by an auger nonradiative recombination process or leaked to outside the active layer.

The auger nonradiative recombination process is expressed as $Cn^3$ (where C is an auger constant, and n is an injected carrier density), and is a fundamental attribute of a material that is generated quantum-mechanically. Leakage to outside the active layer occurs as the quantum barrier overflow of an injected carrier.

In the related art nitride semiconductor light emitting device, a very large internal field fundamentally exists inside the active layer due to the fundamental polar properties of a material, and also a serious carrier overflow occurs because an electron injected into the active layer has hot carrier properties.

As a result, when an injected current increases, the nonradiative loss of electrons and holes is increased, and thus, the light emission efficiency of the active layer, for example, internal quantum efficiency is significantly decreased.

In the nitride semiconductor light emitting device based on the multiple-quantum well structure active layer, the reduction in light emission efficiency that is caused when applying a high current is one of urgent technical limitations in implementing light emitting devices for high output power lighting.

Figure 3:
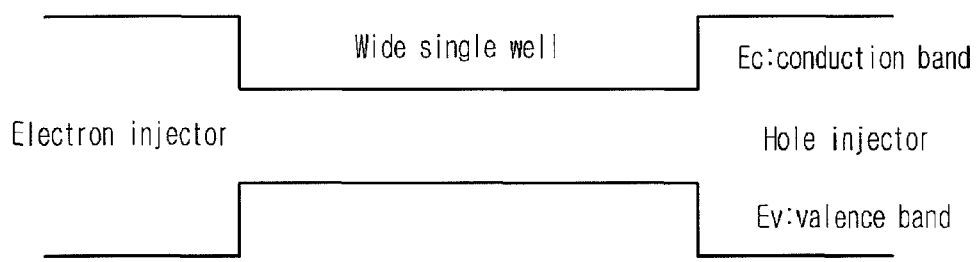
FIG. 3 is a view schematically illustrating an active layer energy band of a related art nitride semiconductor light emitting device including an active layer of a wide single quantum well structure.

FIG. 3 is a view schematically illustrating an active layer energy band of a related art nitride semiconductor light emitting device including an active layer of a wide single quantum well structure.

Figure 4:
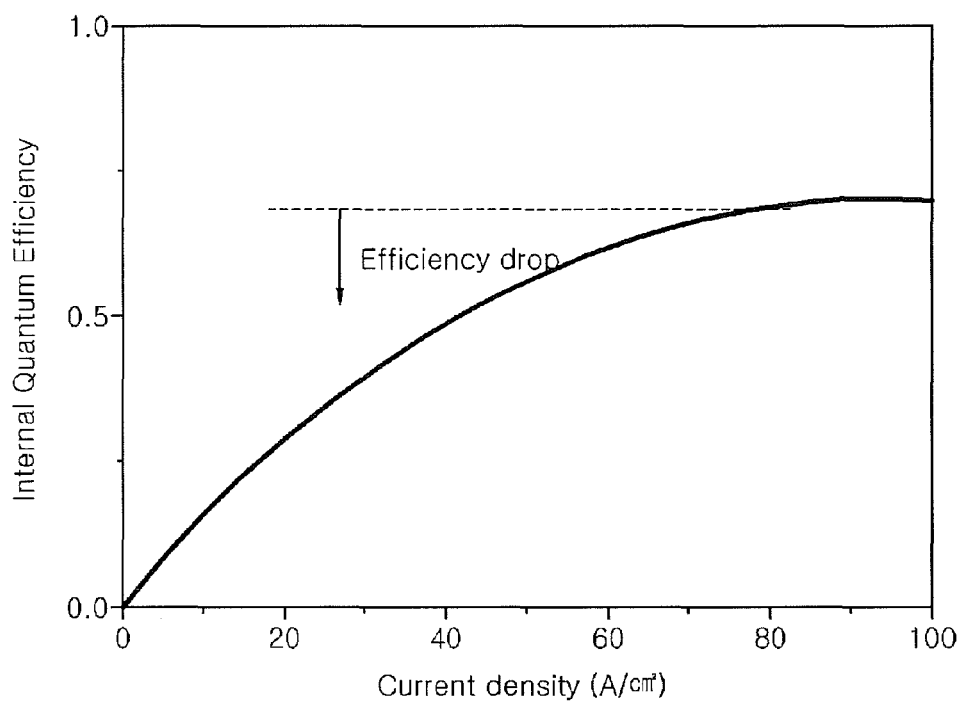
FIG. 4 is a characteristic view showing internal light emission quantum efficiency based on the increase in the injected current amount of a related art nitride semiconductor light emitting device including an active layer of a wide single quantum well structure (see FIG. 3).

FIG. 4 is a characteristic view showing internal light emission quantum efficiency based on the increase in the injected current amount of a related art nitride semiconductor light emitting device including a wide single quantum well structure active layer (see FIG. 3). As shown in FIG. 4, a technology of manufacturing a related art nitride semiconductor light emitting device based on a wide single quantum well structure has a limitation in that light emission quantum efficiency is significantly reduced by nonradiative loss due to a crystal defect in a low current region.

The related art nitride semiconductor light emitting device includes an InGaN single quantum well structure layer, having a relatively thick active layer, as an active layer.

A relatively wide InGaN single quantum well structure active layer (see FIG. 3) can effectively accommodate relatively many electrons and holes compared to the related art multiple-quantum well structure active layer (see FIG. 1). Accordingly, when the amount of injected current is sufficient, the light emission efficiency of the active layer is excellent.

However, a light emitting device using a semiconductor thin film fundamentally has a nonradiative loss attribute due to a crystal defect existing inside the active layer. Such crystal defect-related Shockley-Read-Hall (SHR) nonradiative recombination process is expressed as "An" (where A is an SHR constant, and n is an injected carrier density), and is a dominant carrier recombination process in a low injection current region.

As a result, a nitride semiconductor light emitting device including a relatively thick single quantum well structure active layer is increased relatively in total number of crystal defects existing in an active layer, and thus, a nonradiative loss effect due to the crystal defects is increased. Therefore, the nitride semiconductor light emitting device including the relatively thick single quantum well structure active layer has a limitation in that internal quantum efficiency (light emission efficiency) of a device is very low in a low current injection region.

Consequently, the related art nitride semiconductor light emitting device based on a multiple-quantum well structure active layer has excellent light emission efficiency due to an efficient quantum confinement effect in the low current injection region, but has very low light emission efficiency in a high current injection region. On the other hand, the related art nitride semiconductor light emitting device based on a relatively thick single quantum well structure active layer has excellent light emission efficiency in the high current injection region, but has very low light emission efficiency in the low current injection region. Accordingly, an embodiment proposes an ideal nitride semiconductor light emitting device structure that has excellent light emission efficiency in both the low current injection region and the high current injection region.

In the nitride semiconductor light emitting device, carriers injected from a carrier injection layer into an active layer perform one of the following four processes.

Entire carrier recombination is "$R=An+Bn^2+Cn^3+L(n)$, where n is an injected carrier density, A is an SHR constant, B is a radiative recombination constant, C is an auger constant, L is a carrier leakage process function depending on higher orders of n.

In the four carrier recombination processes, a light emission process is $Bn^2$, and the other three processes are a crystal defect nonradiative process, an auger nonradiative process, and a carrier leakage nonradiative process, respectively.

In order to maximize the internal quantum efficiency of the nitride semiconductor light emitting device, therefore, the effect of the SHR process being a dominant nonradiative process may be minimized when injecting a low current, and the effects of the auger process and carrier leakage process being a dominant nonradiative process may be minimized when injecting a high current.

According to an approach for realizing an embodiment, a quantum confinement effect may be maximized by minimizing a light emission area when injecting a low current, and the light emission area may be maximized when injecting a high current.

According to an embodiment, an active layer structure included in one light emitting device may be a variable multi-functional structure according to an injection current region. According to an embodiment, as one embodiment for realizing a variable multi-functional active layer structure, a dual active layer concept is proposed as follows.

According to an embodiment, the dual (or multiple) active layer concept includes a first active layer that serves as a main layer in a low current region, a second active layer that serves as a main layer in a high current region, and a gate quantum barrier between the first and second active layers, and realizes high LED light emission efficiency in all injection current regions ranging from the low current region to the high current region. According to an embodiment, functions of main elements are as follows.

The first active layer has a quantum well structure, and thus maximizes light emission efficiency due to the limit of a light emission area and a quantum confinement effect, in a the low current region. The first active layer includes a relatively thin quantum well layer, allows a small number of quantum well layers to participate in light emission, and thus minimizes the SHR nonradiative recombination process due to a crystal defect.

The gate quantum barrier controls the quantum-mechanical tunneling and drift transport attributes of carriers to allow the second active layer to mainly participate in light emission, at a certain injection current or higher. According to an embodiment, the gate quantum barrier is disposed between the first and second active layers having a quantum well structure, and may vary the thickness of the gate quantum barrier and the size of the energy band gap to control the amount of critical injection current at which the second active layer start participating in light emission.

The second active layer has a structure that accommodates many carriers, and serves as a main active layer having excellent light emission efficiency in the high current region.

According to an embodiment, for example, by including a thin quantum barrier, the second active layer structure may have a super lattice structure that may form a mini-energy band through quantum-mechanical tunneling, a relatively wide single quantum well structure, or a relatively wide multiple-quantum well structure.

The super lattice structure, the relatively wide single quantum well structure, or the relatively wide multiple-quantum well structure effectively accommodates many carriers to allow the carriers to participate in light emission when injecting a high current, thereby realizing excellent light emission efficiency characteristic in the high current region.

According to an embodiment, a main difference between the first and second active layers is that the second active layer has a quantum-mechanically quantized density of state higher than that of the first active layer. The second active layer has a relatively higher density of state, and thus can effectively accommodate more carriers into a light emission layer than the first active layer.

A wavelength emitted from an active layer of a light emitting device is quantum-mechanically determined according to the width (thickness) of a quantum well layer and the size of an energy band gap. Therefore, the size of the energy band gap of the quantum well layer may be appropriately controlled in order for the second active layer to emit light of a wavelength equal or similar to that of the first active layer.

Wavelengths of two active layers (i.e., the first and second active layers) may be equal or similar for implementing one light emitting device that emits light of single color with good color purity or the same wavelength.

For example, when the light of the first active layer and the light of the second active layer are expressed as color coordinates, a straight line joining the color coordinate of the first active layer and the color coordinate of the second active layer may be positioned in a same color area including the color coordinates of the two active layers. Also, light emitted from each of the first and second active layers may have color purity of 80% or higher.

Figure 5:
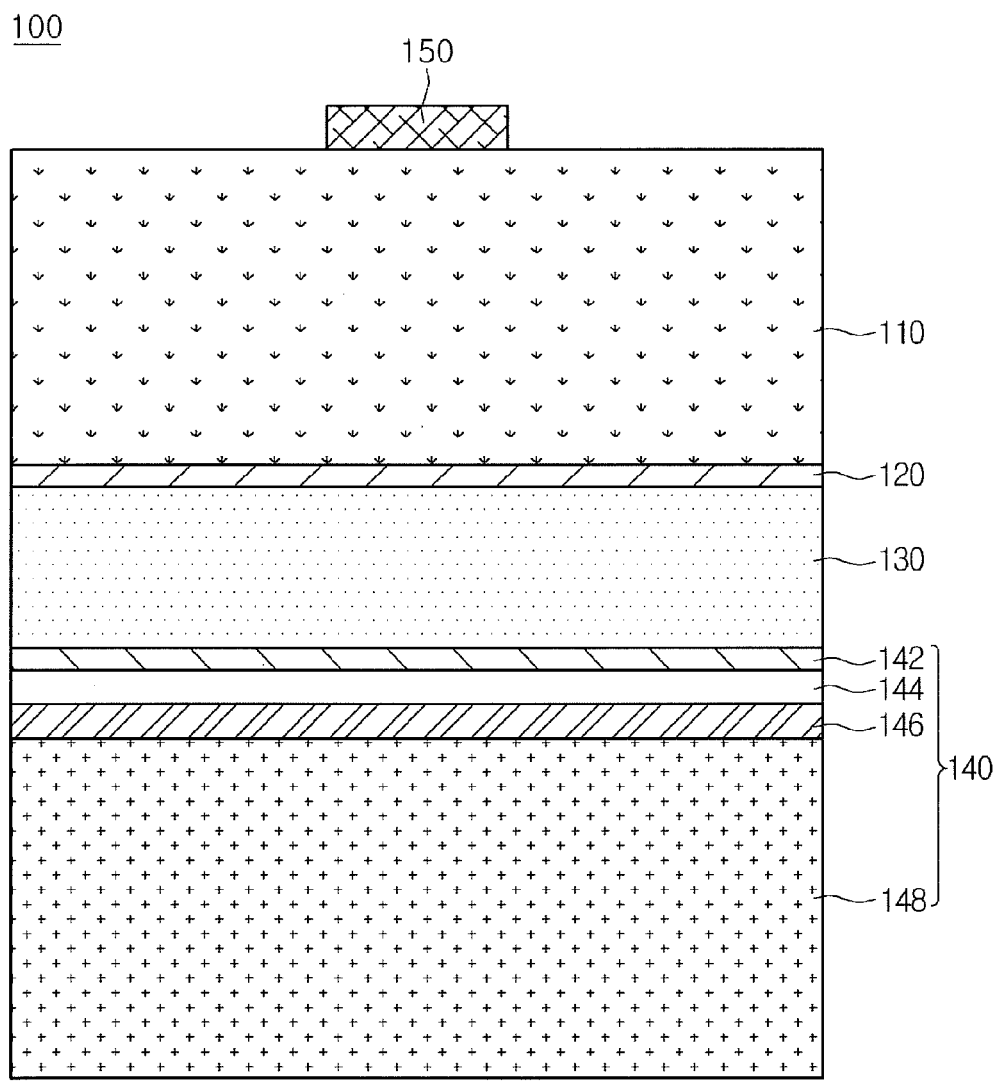
FIG. 5 is an exemplary view illustrating a cross sectional surface of a light emitting device according to an embodiment.

According to an embodiment, when the first active layer that mainly performs a function in the low current region is included adjacently to a hole injection layer, the size of an energy band gap of a quantum well in the first active layer may be equal to or greater than that of an energy band gap of a quantum well in the second active layer. FIG. 5 is a cross sectional view exemplarily illustrating a light emitting device 100 according to an embodiment.

In an embodiment, a vertical light emitting device is mainly described, but is merely an example. An embodiment may be applied to horizontal light emitting devices, flip-chip light emitting devices, and hybrid light emitting devices including a via hole.

The light emitting device 100 according to an embodiment may include a light emitting structure, a second electrode layer 140 formed under the second conductive type semiconductor layer 130, and a first electrode 150 on the first conductive type semiconductor layer 110. Herein, the light emitting structure includes a first conductive type semiconductor layer 110, an active layer 120, and a second conductive type semiconductor layer 130.

The first conductive type semiconductor layer 110 may be formed of a group III-V compound semiconductor doped with a first conductive dopant. When the first conductive type semiconductor layer 110 is an N-type semiconductor layer, the first conductive dopant as an N-type dopant may include Si, Ge, Sn, Se, or Te, but the present disclosure is not limited thereto.

The first conductive type semiconductor layer 110 may include a semiconductor material having a compositional formula of $In_xAl_yGa_{1-x-y}N$ ($0 \leq x \leq 1$, $0 \leq y \leq 1$, $0 \leq x+y \leq 1$).

The first conductive type semiconductor layer 110 may be formed of at least one of GaN, InN, AlN, InGaN, AlGaN, InAlGaN, AlInN, AlGaAs, InGaAs, AlInGaAs, GaP, AlGaP, InGaP, AlInGaP, and InP.

The active layer 120 may include a first active layer 121 that effectively performs a function in the low current region, a second active layer 122 that effectively performs a function in the high current region, and a gate quantum barrier 125 between the first and second active layers 121 and 122, but is not limited thereto. The active layer 120 will be specifically described in the following embodiment.

The second conductive type semiconductor layer 130 may include a group III-V compound semiconductor that is doped with a second conductive dopant, for example, include a semiconductor material having a compositional formula of $In_xAl_yGa_{1-x-y}N$ ($0 \leq x \leq 1$, $0 \leq y \leq 1$, $0 \leq x+y \leq 1$). For example, the second conductive type semiconductor layer 130 may be formed of at least one material selected from among GaN, AlN, AlGaN, InGaN, InN, InAlGaN, AlInN, AlGaAs, GaP, GaAs, GaAsP, and AlGaInP. When the second conductive type semiconductor layer 130 is a P-type semiconductor layer, the second conductive dopant as a P-type dopant may include Mg, Zn, Ca, Sr, Ba, or the like. The second conductive type semiconductor layer 130 may be formed as a single layer or a multi-layer, but the present disclosure is not limited thereto.

In an embodiment, the first conductive type semiconductor layer 110 may be implemented as an N-type semiconductor layer, and the second conductive type semiconductor layer 130 may be implemented as a P-type semiconductor layer, but the present disclosure is not limited thereto. Also, a semiconductor layer having polarity opposite to that of the second conductive type semiconductor layer 130, for example, an N-type semiconductor layer (not shown) may be formed on the second conductive type semiconductor layer 130. Accordingly, the light emitting structure may be implemented as one of an N-P junction structure, a P-N junction structure, an N-P-N junction structure, and a P-N-P junction structure.

The second electrode layer 140 may include a coupling layer 142, an ohmic layer 144, a reflective layer 146, and a conductive support substrate 148.

For example, the coupling layer 142 may include at least one of Ti, Au, Sn, Ni, Cr, Ga, In, Bi, Cu, Ag, and Ta.

For example, the ohmic layer 144 may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, but the present disclosure is not limited thereto.

Moreover, the reflective layer 146 reflects light incident from the light emitting structure, thereby improving the light extraction efficiency.

The reflective layer 146 may be formed of a metal or alloy including at least one of Ag, Ni, Al, Rh, Pd, Ir, Ru, Mg, Zn, Pt, Au, and Hf. Also, the reflective layer 146 may be formed in a multi-layer including the metal or alloy and a light-transmitting conductive material such as IZO, IZTO, IAZO, IGZO, IGTO, AZO, and ATO. For example, the reflective layer 146 may be formed in a stacked structure such as IZO/Ni, AZO/Ag, IZO/Ag/Ni, AZO/Ag/Ni.

The conductive support substrate 148 may support the light emitting structure and supply a power to the light emitting structure. The conductive support substrate 148 may be formed of a metal, a metal alloy, or a conductive type semiconductor material, which has high electric conductivity.

For example, the conductive support substrate 148 may include at least one of copper (Cu), copper alloy, gold (Au), nickel (Ni), molybdenum (Mo), copper-tungsten (Cu—W), and a carrier wafer (for example, Si, Ge, GaAs, GaN, ZnO, SiGe, SiC, or the like).

An electrochemical metal deposition method, a plating method, or a bonding method using a eutectic metal may be used as a method of forming the conductive support substrate 148.

Hereinafter, in embodiments, mechanisms of main elements in an epitaxial structure (hereinafter referred to as an epi structure) will be described in more detail by using some structural examples below.

(First epi Structure)

An epi structure according to a first structural example may be formed in the order of an electron injection layer/second active layer/gate quantum barrier/first active layer/hole injection layer In the first structural example, when injecting a low current, carriers are mainly inputted into the first active layer to emit light. An energy band gap of the first active layer may be equal or similar to that of the second active layer. When the amount of injected current is increased to higher than a certain amount of current, holes pass over the gate quantum barrier and begin filling the second active layer. Therefore, when injecting a high current, the first and second active layers participate in light emission, in which case the second active layer having a greater capacity of accommodating carriers than the first active layer becomes a main light emitting source.

(Second epi Structure)

An epi structure according to a second structural example may be formed in the order of an electron injection layer/third active layer/gate quantum barrier/fourth active layer/hole injection layer.

In the second structural example, when injecting a low current, carriers are mainly inputted into the third active layer to emit light. An energy band gap of the fourth active layer may be greater than that of the second active layer. An energy band gap of the gate quantum barrier may be less than that of the hole injection layer such that holes are effectively injected into the third active layer when injecting a low current. When injecting a high current, electrons fill the third active layer having a relatively less energy band gap, pass over the gate quantum barrier, and are injected into the fourth active layer to participate in light emission.

(Third epi Structure)

An epi structure according to a third structural example may be formed in the order of an electron injection layer/ fourth active layer/gate quantum barrier/third active layer/ gate quantum barrier/fourth active layer/hole injection layer. In the third epi structure, when injecting a low current, carriers are mainly inputted into the third active layer to emit light. An energy band gap of the fourth active layer may be greater than that of the third active layer. An energy band gap of the gate quantum barrier may be less than that of the hole injection layer such that holes are effectively injected into the third active layer when injecting a low current.

When injecting a high current, electrons fill the third active layer having a relatively less energy band gap, drift-transport the gate quantum barrier, and are injected into the fourth active layer adjacent to the hole injection layer to participate in light emission. When injecting a high current, holes fill the third active layer, drift-transport the gate quantum barrier, and are injected into the fourth active layer to participate in light emission.

An innovation point of an embodiment is to propose an intelligent smart light emitting structure that overcomes the fundamental/structural limits of the related art nitride semiconductor light emitting device including a single active layer.

The related art light emitting device based on a nitride semiconductor thin film, emitting a single color (i.e., single wavelength), includes one active layer in a thin film. The related art light emitting device based on a nitride semiconductor thin film, emitting dual colors or triple colors (i.e., multiple wavelengths), includes two or three active layers in a thin film.

However, such multiple-wavelength light emitting device is technology that simultaneously emits blue light and green light, or blue light, green light and red light, and thus realizes white LED without using a fluorescent material. An intelligent active layer structure including a multiple active layer, according to an embodiment, enables the nitride semiconductor light emitting device emitting a single color (i.e., single wavelength) to realize excellent light emission efficiency in all injection current regions ranging from a low injection current region to a high injection current region, and thus has a differentiated point by providing a concept that can overcome the fundamental limit of the related art nitride semiconductor light emitting device technology.

Hereinafter, a light emitting device, a light emitting device package, and a lighting system, according to embodiments, will be described in detail for each embodiment.

<First Embodiment>

Figure 6:
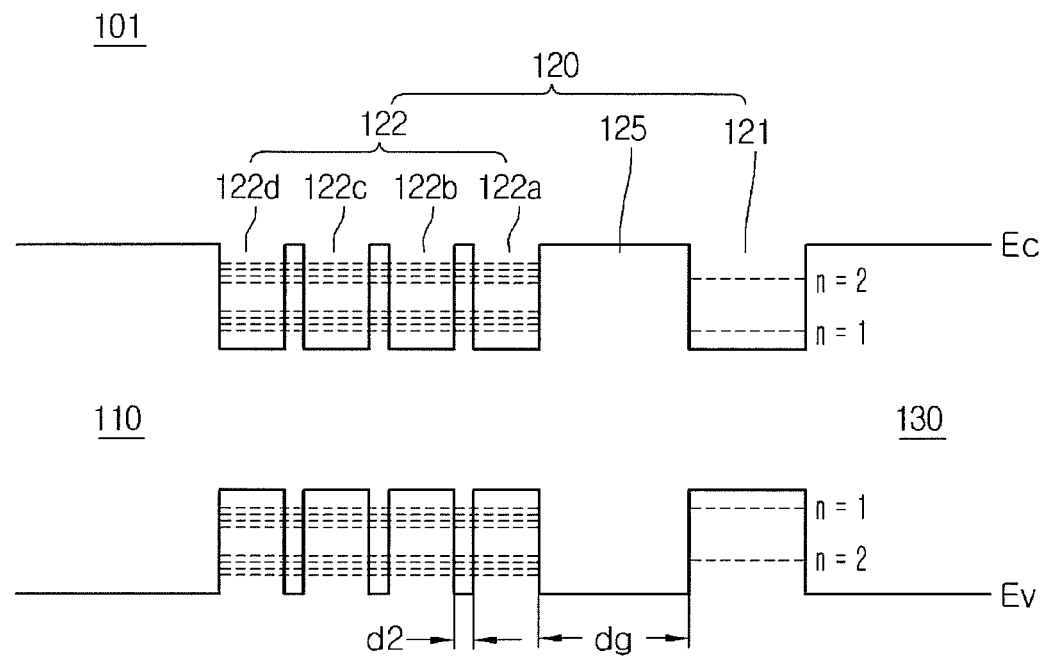
FIG. 6 is a view schematically illustrating an energy band gap of an active layer of a light emitting device including first and second active layers (i.e., dual active layer), in a light emitting device according to a first embodiment.

FIG. 6 is a view schematically illustrating an energy band gap of an active layer of a light emitting device including a dual active layer based on the first epi structure, in a light emitting device according to a first embodiment. In the first embodiment, the second active layer may have a super lattice structure, and the first active layer may have a single quantum well structure.

A light emitting device 100 according to the first embodiment may include a first conductive type semiconductor layer 110, a second conductive type semiconductor layer 130, and an active layer 120 between the first and second conductive type semiconductor layers 110 and 130. The first conductive type semiconductor layer 110 may be an electron injection layer, and the second conductive type semiconductor layer 130 may be a hole injection layer. However, the present disclosure is not limited thereto.

The active layer 120 may include a first active layer 121 adjacent to the second conductive type semiconductor layer 130, a second active layer 122 adjacent to the first conductive type semiconductor layer 110, and a gate quantum barrier 125 between the first and second active layers 121 and 122.

In the light emitting structure according to the first embodiment, the active layer 120 may include the first active layer 121 having a single quantum well structure that effectively performs a function in the low current region, the second active layer 122 having a super lattice structure that effectively performs a function in the high current region, and the gate quantum barrier 125 between the first and second active layers 121 and 122.

In the light emitting structure according to the first embodiment, in implementing the active layer 120, a light emitting region related to light emission may be minimally designed with a quantum well structure in order to solve the reduction in light emission efficiency due to a crystal defect when injecting a low current, and a light emitting region related to light emission may be maximally designed with a super lattice structure when injecting a high current.

In the first embodiment, the low current may be about 5 A/cm$^2$ or less, and the high current may be about 35 A/cm$^2$ or higher. However, the present disclosure is not limited thereto.

The first active layer 121 includes a quantum well including a quantized energy level that is formed quantum-mechanically. In the first active layer 121, for convenience, n schematically indicates the quantum number of quantized energy level where holes and electrons are placed in a quantum well showing a quantum effect.

The second active layer 122 is a light emission layer having a super lattice structure. In the multiple-quantum well structure of the second active layer 122, a quantum barrier may no longer show a quantum confinement effect when the quantum barrier is sufficiently thin, and electrons or holes confined in the quantum well pass through the thin quantum barrier by a quantum-mechanical tunneling effect and form a specific mini-energy band by spreading into an entire super lattice. In the first embodiment, the band structure may be called a super lattice mini-band, but the present disclosure is not limited thereto.

In this embodiment, the super lattice structure of the second active layer 122 is a light emission region emitting light, and is differentiated from that the related art super lattice structure for moderating stress or injecting carriers is not a light emission region.

The second active layer 122 may include a plurality of multiple-quantum well structures 122a to 122d and a multiple quantum (not shown), and the quantum barrier of the second active layer 122 enables the quantum-mechanical tunneling of carriers (electrons or holes).

For example, the quantum barrier of the second active layer 122 may have a thickness d2 from about 0.2 nm to about 7 nm. For example, in the super lattice structure of the second active layer 122, an effective mini-band may be formed when the thickness of the quantum barrier is about 7 mm or less, and injected holes may be effectively distributed into an entire super lattice.

Each of the quantum wells 122a to 122d of the second active layer 122 may have a thickness of about 2 nm to about 10 nm, but the present disclosure is not limited thereto.

In this embodiment, when a low current is applied, the gate quantum barrier 125 may confine a hole, injected into the first active layer 121 through the second conductive type semiconductor layer 130, such that the injected hole cannot be transferred to the second active layer 122. When a high current equal to or higher than a certain injection current is applied, the gate quantum barrier 125 may allow a hole, injected into the first active layer 121 through the second conductive type semiconductor layer 130, to be effectively transferred to the second active layer 122 through drift-transport.

For example, a thickness dg of the gate quantum barrier 125 may be about 3 nm to about 15 nm. In a case where the gate quantum barrier 125 has a thickness of less than about 3 nm, holes may not effectively be confined in the quantum well of the first active layer 121 when a low current is injected. In a case where the gate quantum barrier 125 has a thickness of greater than about 15 nm, holes may not effectively pass over the gate quantum barrier 125 when a high current is injected For example, the thickness dg of the gate quantum barrier 125 may be about 4 nm to about 12 nm, but the present disclosure is not limited thereto. In a case where the gate quantum barrier 125 has a thickness of about 4 nm or greater, holes may more effectively be confined in the quantum well of the first active layer 121 when a low current is injected. In a case where the gate quantum barrier 125 has a thickness of about 12 nm or less, holes may more effectively pass over the gate quantum barrier 125 and be injected into the second active layer 122 when a high current is injected.

The size of the energy band gap of the gate quantum barrier 125 may be greater than that of the energy band gap of the quantum well in the first active layer 121, and be equal to or less than that of the energy band gap of the second conductive type semiconductor layer 130. When a low current is injected, the size of the energy band gap of the gate quantum barrier 125 may be greater than that of the energy band gap of the quantum well in the first active layer 121 in order to effectively confine holes in the quantum well of the first active layer 121.

As an injected current increases, the number of holes accumulated into the quantum well of the first active layer 121 increases, and a portion of holes is vanished by emitting light in combination of electrons.

When a high current is injected, holes may more effectively pass over the gate quantum barrier 125 and be injected into the second active layer 122, for which the size of the energy band gap of the gate quantum barrier 125 may be less than that of the energy band gap of the quantum well 121 in the second conductive type semiconductor layer 130. The energy band gap of the gate quantum barrier 125 may be changed by controlling the composition of a nitride semiconductor ($In_zAl_yGa_{1-x-y}N$, $0 \leq x$, $y \leq 1$) gate quantum barrier.

In this embodiment, the main mechanism of the ideal active layer 120 uses the unique attributes of nitride semiconductor materials where electrons in the nitride semiconductor active layer 120 have low effective mass and high mobility, and holes in the nitride semiconductor active layer 120 have relatively higher effective mass and very low mobility.

When a low current is injected, electrons injected from the first conductive type semiconductor layer 110 (for example, an electron injection layer) into the active layer 120 may easily pass over the second active layer 122 having a super lattice structure and the gate quantum barrier 125 and reach the quantum well layer of the first active layer 121 because the electrons have relatively high mobility in the active layer 120.

When a low current is injected, holes injected from the second conductive type semiconductor layer 130 (for example, a hole injection layer) into the active layer 120 may be quantum-mechanically confined in the quantum well of the first active layer 121 adjacent to the hole injection layer and not effectively pass over the gate quantum barrier 125 because the holes have high effective mass and low mobility.

On the other hand, when a high current is injected, holes injected from the hole injection layer into the active layer fill all the quantum wells of the first active layer 121, and then, surplus holes pass over the gate quantum barrier 125 and reach the second active layer 122 of a super lattice structure. The second active layer 122 may effectively accommodate a lot of surplus holes, and by participating in light emission, the second active layer 122 serves as a main active layer when a high current is injected. When a high current is injected, electrons injected from the electron injection layer into the active layer may be easily distributed in the entire active layer.

Mechanism of this embodiment will be described below in more detail with reference to FIG. 6.

When a low current is injected, holes injected from the second conductive type semiconductor layer 130 (for example, a hole injection layer) into the active layer are injected into the quantum well of the first active layer 121. Holes injected into the quantum well of the first active layer 121 are placed at a quantized energy level "n=1" having the lowest energy state. Holes placed at the quantized energy level "n=1" are quantum-mechanically confined in a quantum well, and since the holes have relatively high effective mass and low mobility compared to electrons, the holes do not pass through the gate quantum barrier 125 and move to the second active layer 122. According to this embodiment, the quantum well of the first active layer 121 may have a thickness of about 2 nm to about 16 nm. According to this embodiment, the quantum well of the first active layer 121 may have a thickness of about 2 nm to about 10 nm. Electrons injected from the first conductive type semiconductor layer 110 (for example, an electron injection layer) into the active layer 120 have low quantum-mechanical effective mass and high mobility compared to holes, and thus, the injected electrons may easily pass through the second active layer 122 and the gate quantum barrier 125 and reach the quantum well of the first active layer 121.

Electrons injected into the quantum well of the first active layer 121 are placed at the quantized energy level "n=1" having the lowest energy state. As a result, electrons and holes, which have been injected when injecting a low current, are combined in the quantum well of the first active layer 121 to emit light.

On the other hand, when a high current is injected, holes injected from the second conductive type semiconductor layer 130 (for example, a hole injection layer) into the active layer 120 fill all quantized energy levels in the quantum wells of the first active layer 121, and then, surplus holes pass over the gate quantum barrier 125 and are injected into the second active layer 122. The second active layer 122 includes a super lattice mini-band, and thus may quantum-mechanically accommodate relatively more holes than the quantum well of the first active layer 121, in the mini-band.

According to this embodiment, the second active layer 122 may have a super lattice structure where a quantum well having a small energy band gap and a quantum barrier having a large energy band gap are alternately stacked at least two times or more, and the tunneling of electrons and holes may be performed quantum-mechanically. According to this embodiment, the number of quantum wells in the first active layer 122 may be about two to about twenty.

According to this embodiment, the size of the energy band gap of the quantum well in the first active layer 121 may be equal to or greater than that of the energy band gap of the quantum wells 122a to 122d. This is because holes pass over the gate quantum barrier 125 in the first active layer 121 and are effectively transported to the second active layer 122 when an injected current is equal to or greater than a certain value. Hole injection efficiency is fundamentally increased when holes are injected from a position having a high energy state to a position having a low energy state.

Holes injected into the second active layer 122 are effectively dispersed into an entire super lattice, and are quantum-mechanically combined with electrons injected from the electron injection layer to emit light. As a result, electrons and holes, which have been injected when injecting a high current, may be dispersed into the first and second active layers 121 and 122 and effectively combined therein to emit light.

According to this embodiment, the amount of injected current necessary for the operation of a device may not clearly be differentiated in a low current region and a high current region but variably selected and controlled according to usability of a light emitting device to be implemented.

According to this embodiment, injection efficiency of holes injected from the first active layer 121 into the second active layer 122 may be effectively controlled according to the energy barrier height and thickness of the gate quantum barrier 125. According to this embodiment, furthermore, injection efficiency of holes injected from the first active layer 121 into the second active layer 122 may be effectively varied by relatively controlling the size of the energy band gap in the first active layer 121 and the size of the energy band gap in the second active layer 122.

According to this embodiment, when the energy band gap of the first active layer 121 is equal to or greater than that of the second active layer 122 in size, holes may be effectively transported from the first active layer 121 to the second active layer 122 at a certain injection current or higher.

Figure 7:
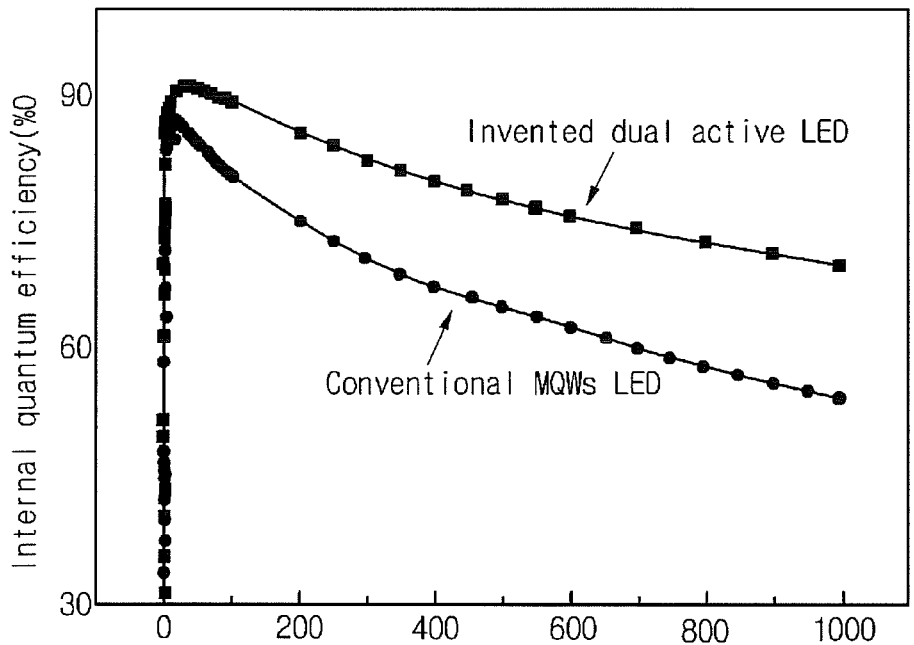
FIG. 7 is a characteristic view showing light emission efficiency based on an injected current of a dual-active nitride semiconductor light emitting device according to a first embodiment.

FIG. 7 shows light emission efficiency characteristic based on the injection current of a dual-active nitride semiconductor light emitting device according to a first embodiment. In manufacturing a device, a thin film growth process uses Low-Pressure Metal-Organic Chemical Vapor Deposition system (LPMOCVD), but the present disclosure is not limited thereto. A sapphire substrate has been used as a substrate. The substrate has been removed by applying a laser lift-off process, and thereafter, a vertical LED chip has been manufactured.

To compare effects, a related art blue light emitting device including five quantum well layers has been manufactured. According to FIG. 7, a dual-active light emitting device according to the embodiment shows better light emission efficiency characteristics in all injection current regions than internal light emission efficiency of a related art nitride semiconductor blue light emitting device based on a multiple-quantum well structure.

According to the first embodiments, the light emitting device according to the first embodiment shows light efficiency that has been improved further by at least 30% than the related art light emitting device, at an injection current of about 1000 mA.

<Second Embodiment>

Figure 8:
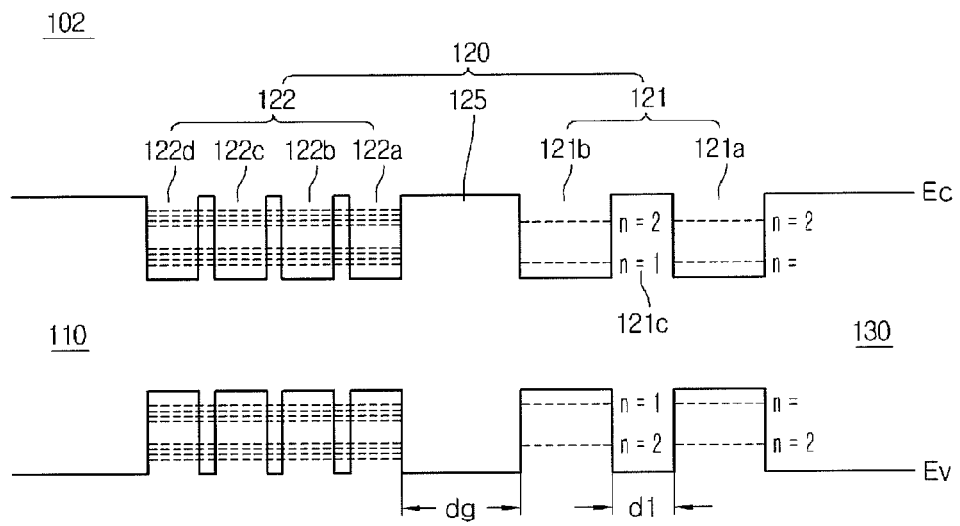
FIG. 8 is a view schematically illustrating an energy band gap of an active layer of a dual-active light emitting device having a dual active layer which includes a first active layer of a multiple-quantum well structure and a second active layer of a super lattice structure, in a light emitting device according to a second embodiment.

FIG. 8 is a view schematically illustrating an energy band gap of an active layer in a light emitting device (see the first structure) including a dual-active layer according to a second embodiment. In the second embodiment, a second active layer has a super lattice structure, and a first active layer has a multiple-quantum well structure including two quantum well layers. The second embodiment may apply the technical features of the first embodiment.

A light emitting device 102 according to the second embodiment may include a first active layer 121 having a multiple-quantum well structure, and thus may include a plurality of quantum wells 121a and 121b, and a quantum barrier 121c.

In the second embodiment, even when a current is injected in a low current region and an intermediate region, the first active layer 121 may effectively operate as a main active layer compared to a case where the first active layer 121 has a multiple-quantum well structure and a case where the first active layer 121 includes a single quantum well.

For example, when a low current is injected, holes injected from the second conductive type semiconductor layer 130 (for example, a hole injection layer) are confined in a first quantum well 121a of the first active layer 121, and thereafter are combined with electrons to emit light.

When a current is injected in the intermediate region, holes injected from the hole injection layer fill quantized energy levels of the first quantum well 121a in the first active layer 121, and then, surplus holes pass over a quantum barrier 121c in the first active layer 121, are injected into a second quantum well 121b, and are combined with electrons to emit light.

In the second embodiment, the number of quantum wells in the first active layer 121 may be about two to about three.

According to the second embodiment, in a case where the number of quantum wells exceeds three in the multiple-quantum well structure of the first active layer 121, a relatively large serial resistance is given to holes, which are injected from the hole injection layer into the second active layer 122 in injecting a high current, when the injected holes pass through the first active layer 121 having the multiple-quantum well structure, and thus, hole injection efficiency toward the second active layer 122 is decreased. Therefore, in a case where the number of quantum wells exceeds three in the multiple-quantum well structure of the first active layer 121, the second active layer 122 cannot effectively operate as a main active layer when injecting a high current.

In the second embodiment, the quantum barrier 121c of the first active layer 121 may be equal to or less than the thickness dg of the gate quantum barrier 125. In the second embodiment, for example, the quantum barrier 121c of the first active layer 121 may be about 0.2 nm to about 7 nm.

According to the second embodiment, in a case where a thickness d1 of the quantum well 121c in the first active layer 121 exceeds about 7 nm, holes, which are injected from the hole injection layer into the active layer 120 in injecting an intermediate current and a high current, fill the first quantum well 121a of the first active layer 121, and then, a high serial resistance and nonradiative loss are given to surplus holes when the surplus holes pass through the relatively thick quantum barrier 121c, thereby decreasing hole injection efficiency toward the second quantum well 121b and the second active layer 122.

Therefore, when the thickness d1 of the quantum barrier 121c in the first active layer 121 exceeds about 7 nm, the second quantum well 121b of the first active layer 121 and the second active layer 122 may not effectively participate in light emission in injecting an intermediate current and a high current.

In the second embodiment, the thickness of the quantum well in the first active layer 121 may be about 2 nm to about 10 nm. According to this embodiment, the size of an energy band gap of the quantum barrier 121c in the first active layer 121 may be equal to or less than that of an energy band gap of the gate quantum barrier 125. According to the second embodiment, injection efficiency of holes, which are injected from the first active layer 121 into the second active layer 122 in increasing an injected current, may be increased as the height of an energy barrier of the quantum barrier 121c in the first active layer 121 becomes less and the thickness of the energy barrier of the quantum barrier 121c becomes less.

The intermediate current may be about 5 A/m2 or higher to about 35 A/m2 or less. However, the present disclosure is not limited thereto.

Hereinafter, a method of manufacturing the light emitting device according to the first and second embodiments will be described.

For example, a first conductive type semiconductor layer 110, an active layer 120 and a second conductive type semiconductor layer 130 are formed on a substrate (not shown) such as a sapphire substrate. For example, a nitride semiconductor electron injection layer is grown on the substrate (not shown), and a nitride semiconductor active layer and a hole injection layer are grown and manufactured on the substrate.

A second active layer 122 including a super lattice structure may be manufactured on a nitride semiconductor electron injection layer thin film, and a gate quantum barrier 125 may be manufactured between the second active layer 122 and the first active layer 121.

The super lattice structure of the second active layer 122 may be manufactured by stacking a plurality of nitride semiconductor layers having different energy band gaps. When the super lattice structure of the second active layer 122 may be manufactured by repeatedly stacking a plurality of nitride semiconductor layers having different energy band gaps, the number of repeats may be at least two times or more. A nitride semiconductor layer, having a large energy band gap in the super lattice structure of the second active layer 122, may have a thickness of about 0.2 nm to about 7 nm, but the present disclosure is not limited thereto.

A nitride semiconductor layer, having a small energy band gap in the super lattice structure of the second active layer 122, may have a thickness of about 2 nm to about 10 nm, but the present disclosure is not limited thereto. The gate quantum barrier 125 between the second active layer 122 and the first active layer 121 may have a thickness of about 3 nm to about 15 nm, but the present disclosure is not limited thereto.

Light emitted from the second active layer 122 and light emitted from the first active layer 121 may be manufactured to have an equal or similar wavelength. The number of quantum wells in the first active layer 121 may be about one to about three. A quantum well layer of the first active layer 121 may have a thickness of about 2 nm to about 10 nm, but the present disclosure is not limited thereto. When the first active layer 121 has a multiple-quantum well structure, a thickness d2 of a quantum barrier may be manufactured as about 0.2 nm to about 7 nm, but the present disclosure is not limited thereto.

<Third Embodiment>

Figure 9:
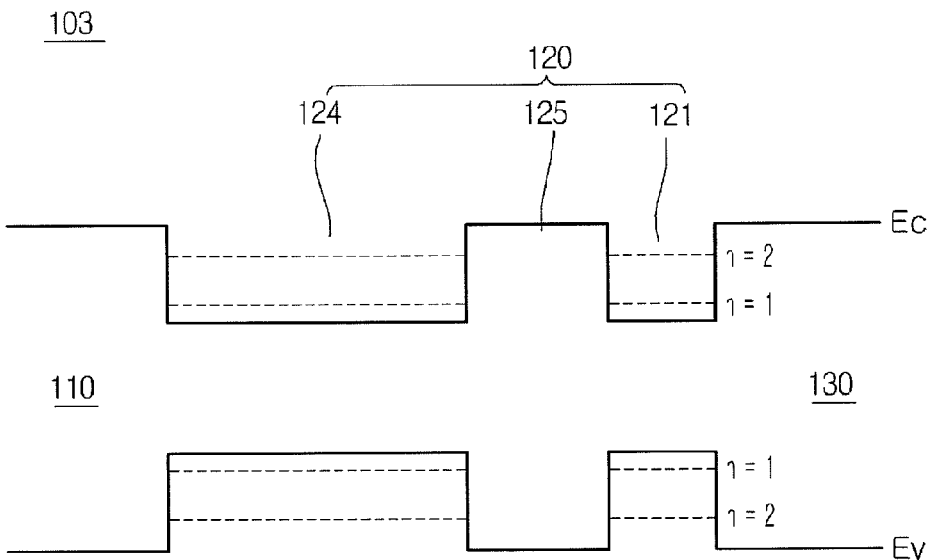
FIG. 9 is a view schematically illustrating an energy band gap of an active layer of a light emitting device having a dual active layer which includes a first active layer of a narrow single quantum well structure and a second active layer of a wide single quantum well structure, in a light emitting device according to a third embodiment.

FIG. 9 is a view schematically illustrating an energy band gap (103) of an active layer in a light emitting device (see the first epi structure) including a dual-active layer according to a third embodiment. In the third embodiment, a second active layer 124 has a single quantum well structure having a relatively wide width, and a first active layer 121 include a single quantum well structure having a relatively narrow width.

The third embodiment may apply the technical characteristics of the first and second embodiments.

In the light emitting structure according to the third embodiment, a dual active layer includes the first active layer 121 having a narrow single quantum well that operates effectively in a low current region, the second active layer 124 having a wide single quantum well that operates effectively in a high current region, and a gate quantum barrier 125 disposed between the first and second active layers 121 and 124.

In the second embodiment, moreover, the first active layer 121 according to the third embodiment may include one or more quantum well layers.

According to the third embodiment, the first active layer 121 is formed relatively thinner than the second active layer 124, and thus has better quantum-mechanical quantum well confinement effect.

The thickness of the first active layer 121, disposed adjacently to the second conductive type semiconductor layer 130, may be about 1 nm to about 10 nm. When the thickness of the first active layer 121 is less than about 1 nm, a sufficient amount of energy level may not quantum-mechanically be formed in an active layer (a light emission layer).

When the thickness of the first active layer 121 is greater than about 10 nm, a quantum well confinement effect is relatively reduced quantum-mechanically. The first active layer 121 can provide excellent light emission efficiency due to a quantum confinement effect when injecting a low current. According to this embodiment, the second active layer 124 may have a thickness of about 3 nm to about 300 nm. When the thickness of the second active later 124 is about 300 nm or more, a nonradiative loss effect due to a crystal defect is considerably increased, and thus the light emission efficiency of a light emitting device is largely decreased. In a case where the thickness of the second active layer 124 is less than about 3 nm, if a number of carriers are injected, the second active layer 124 cannot effectively accommodate the carriers, and thus, the light emission efficiency of a device is decreased.

According to the third embodiment, the first active layer 121 is relatively thinner than the second active layer 124.

According to the third embodiment, the second active layer 124 that is disposed adjacently to a first conductive type semiconductor layer 110 being an electron injection layer enables N-type doping. For example, electrons that are injected into the second active layer 124 doped in an N type may pass through the second active layer 124 and be effectively injected into the first active layer 121.

In the light emitting device according to this embodiment, the first active layer 121 may act as a main active layer when a low current is injected, and the second active layer 124 may act as a main active layer when a high current is injected.

According to the third embodiment, the size of the energy band gap of the second active layer 124, disposed near the first conductive type semiconductor layer 110 being an N-type semiconductor layer, may be equal to or less than that of the energy band gap of the first active layer 121 which is disposed near the second conductive type semiconductor layer 130 being a P-type semiconductor layer.

According to this embodiment, when a low current is injected into the light emitting device, holes may be sufficiently filled and then confined in the first active layer 121 having a low quantized energy level, allow light to be emitted from the first active layer 121, and thereafter move to the second active layer 124. In this case, the gate quantum barrier 125 may be disposed between the second active layer 124 and the first active layer 121, and formed to a thickness of about 3 nm to about 8 nm.

Figure 10:
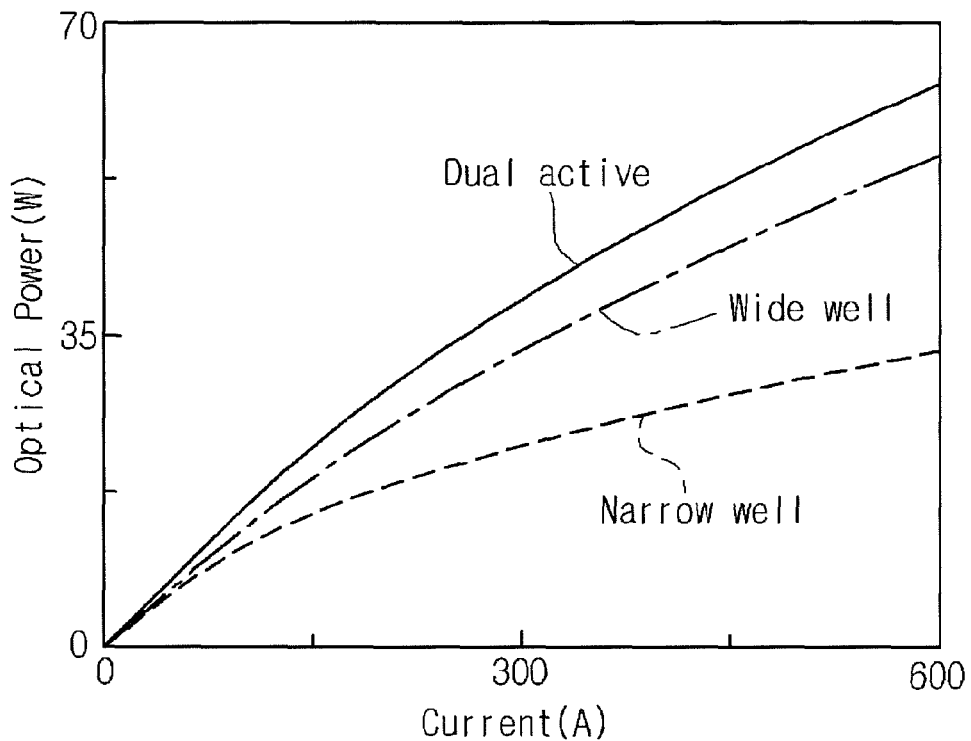
FIG. 10 is a view showing optical output power characteristic based on an injected current of a nitride semiconductor blue light emitting device including a dual active layer, in a light emitting device according to a third embodiment.

According to the third embodiment, the first active layer 121 is described as one, but may be formed as two or more. FIG. 10 is a view showing optical output power characteristic based on the injection current of a dual-active nitride semiconductor blue light emitting device according to the third embodiment.

According to the third embodiment, FIG. 10 shows that the first active layer including a narrow quantum well operates in the low current region and the second active layer including a wide quantum well mainly operates in the high current region.

<Fourth Embodiment>

Figure 11:
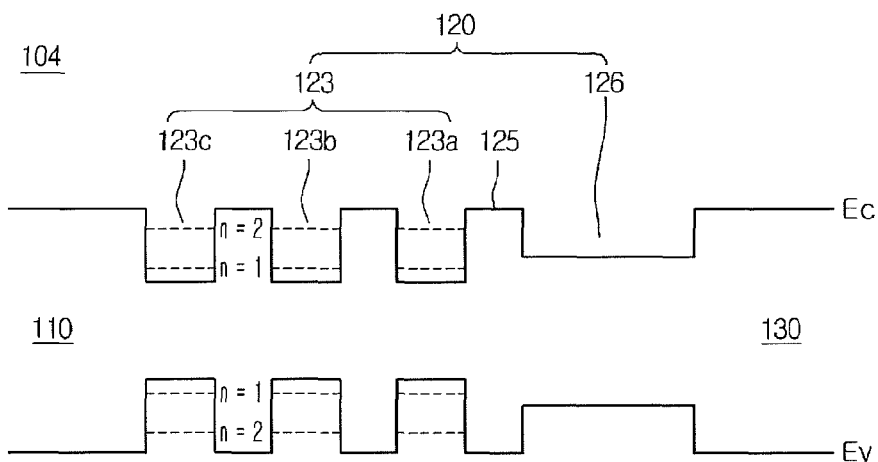
FIG. 11 is a view schematically illustrating an energy band gap of a nitride semiconductor light emitting device including first and second active layers (i.e., dual active layer), in a light emitting device according to a fourth embodiment.

FIG. 11 is a view schematically illustrating an energy band gap (104) of a nitride semiconductor light emitting device including a dual active layer which includes a third active layer of a multiple-quantum well structure and a fourth active layer of a wide single quantum well structure, in a light emitting device according to a fourth embodiment.

The fourth embodiment may apply the technical characteristics of the first to third embodiments.

According to the fourth embodiment, a third active layer 123 adjacent to a first conductive type semiconductor layer 110 being an electron injection layer may have a multiple-quantum well structure, and a fourth active layer 126 adjacent to a second conductive type semiconductor layer 120 being a hole injection layer may have a wide single quantum well structure.

Each quantum well in the third active layer 123 may have a thickness of about 1 nm to about 10 nm, and the third active layer 123 may have a thickness of about 3 nm to about 300 nm. According to the fourth embodiment, the thickness of the fourth active layer 126 may be greater than that of each quantum well in the third active layer 123.

According to the fourth embodiment, the fourth active layer 126 may be P-doped. According to the fourth embodiment, the size of an energy band gap of the fourth active layer 126 having the wide well structure may be equal to or greater than that of an energy band gap of the quantum well in the third active layer 123.

When a low current is injected into the light emitting device, the fourth active layer 126 may have a relatively large energy band gap. For example, since the fourth active layer 126 has been P-doped, holes may pass through the fourth active layer 126 and be injected into the third active layer 123. Furthermore, electrons injected from the first conductive type semiconductor layer 110 are combined with the holes to emit light, in the third active layer 123.

According to the fourth embodiment, the size of the energy band gap of the fourth active layer 126 adjacent to the second conductive type semiconductor layer 130 being a hole injection layer may be equal to or greater than that of the energy band gap of the first conductive type semiconductor layer 110 being an electron injection layer, in terms of hole injection efficiency.

Herein, a difference between the first epi structure (see the first to third embodiments) and the structure according to the fourth embodiment is that the fourth active layer 126 adjacent to a P-type conductive type semiconductor layer includes a wide well, namely, a well for a high current, and thus, when the size of the energy band gap of the third active layer 123 is the same as that of the energy band gap of the fourth active layer 126, since the fourth active layer 126 is relatively thicker, an energy level quantized in a thicker quantum well may have an energy state quantum-mechanically lower than that of a ground state (n=1) energy level in the third active layer 123 which is relatively thinner.

Therefore, the thick fourth active layer 126 adjacent to a P-type conductive type semiconductor layer may have an energy band gap greater than that of the third active layer 123 even a little, in regard to the same mechanism as that of the first epi structure, namely, in regard to the increase in hole injection efficiency.

Moreover, unlike the first epi structure, the fourth active layer 126 is adjacent to the P-type conductive type semiconductor layer 130 in the second epi structure (see the fourth embodiment). Accordingly, when a low current is injected, holes should be injected to the third active layer 123 to primarily emit light, and thus unlike the first epi structure, the gate quantum barrier 125 may be designed relatively further thinly such that tunneling is effectively performed when injecting a low current, in the second epi structure.

Figure 12:
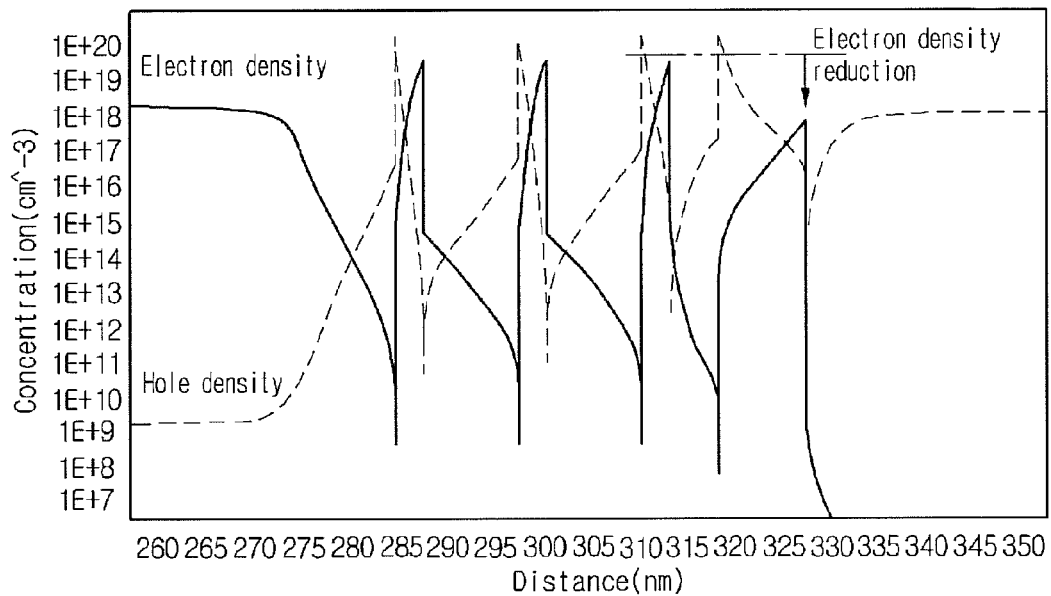
FIG. 12 is a view showing a distribution of electrons and holes inside a dual active layer when a low current is injected into a light emitting device including the dual active layer, in a light emitting device according to a fourth embodiment.

According to the fourth embodiment, as shown in FIG. 12, when a low current is injected into the light emitting device, electrons injected from the first conductive type semiconductor layer 110 are mainly confined in the third active layer 123, but an electronic concentration is relatively reduced in the fourth active layer 126.

FIG. 12 is a view showing a distribution of electrons and holes inside a dual-active layer when a low current is injected into a light emitting device including the dual-active layer, according to a fourth embodiment.

When a high current is injected into the light emitting device, some of electrons injected from the first conductive type semiconductor layer 110 into the active layer fill all quantized energy levels in the multiple-quantum well of the third active layer 123, and surplus electrons pass over the gate quantum barrier 125 and are injected into the fourth active layer 126 through tunneling or a drift transport process.

Figure 13:
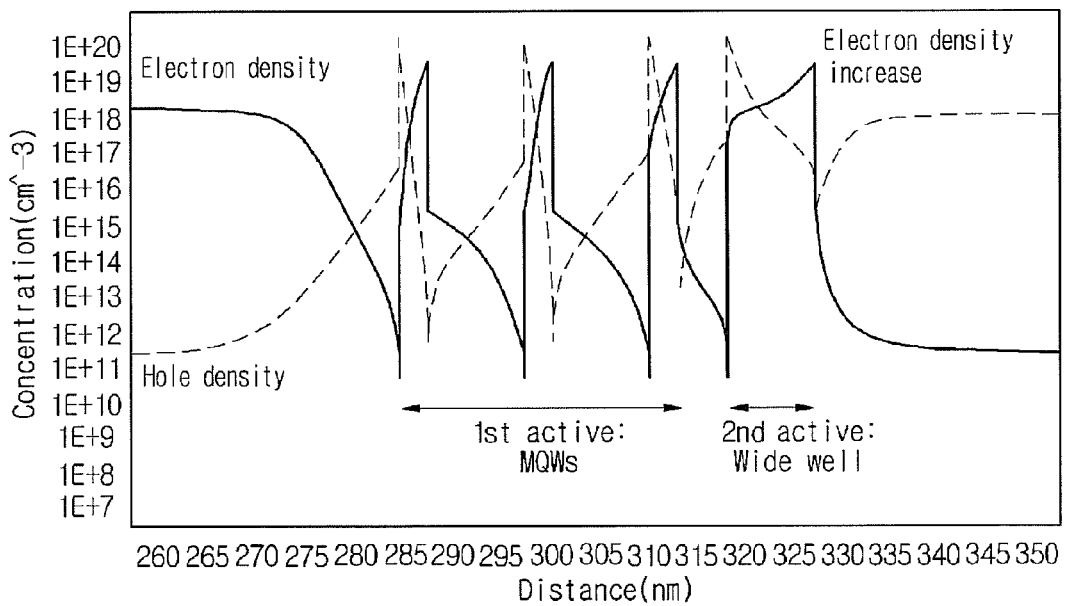
FIG. 13 is a view showing a distribution of electrons and holes inside a dual active layer when a high current is injected into a light emitting device including the dual active layer, in a light emitting device according to a fourth embodiment.

According to the fourth embodiment, as shown in FIG. 13, when a high current is injected into the light emitting device, an electron concentration is relatively increased in the fourth active layer 126 in a case of electrons injected from the first conductive type semiconductor layer 110.

FIG. 13 is a view showing a distribution of electrons and holes inside a dual-active layer when a high current is injected into a light emitting device including the dual-active layer, according to a fourth embodiment.

That is, as shown in FIG. 12, when a low current is injected into the light emitting device, light is mainly emitted from the third active layer 123 because an electron concentration is reduced in the fourth active layer 126. However, as shown in FIG. 13, when a high current is injected, light is conformally emitted from the third and fourth active layers 123 and 126.

The fourth active layer 126 is thicker than the multiple-quantum well of the third active layer 123 and thus can effectively accommodate a lot of electrons, which are combined with holes to emit light.

According to the fourth embodiment, therefore, electrons and holes, which have been injected into the active layer when injecting a high current, may be dispersed into the third and fourth active layers 123 and 126 and effectively combined therein to emit light, thereby providing high light emission efficiency in a high injection current region.

Figure 14:
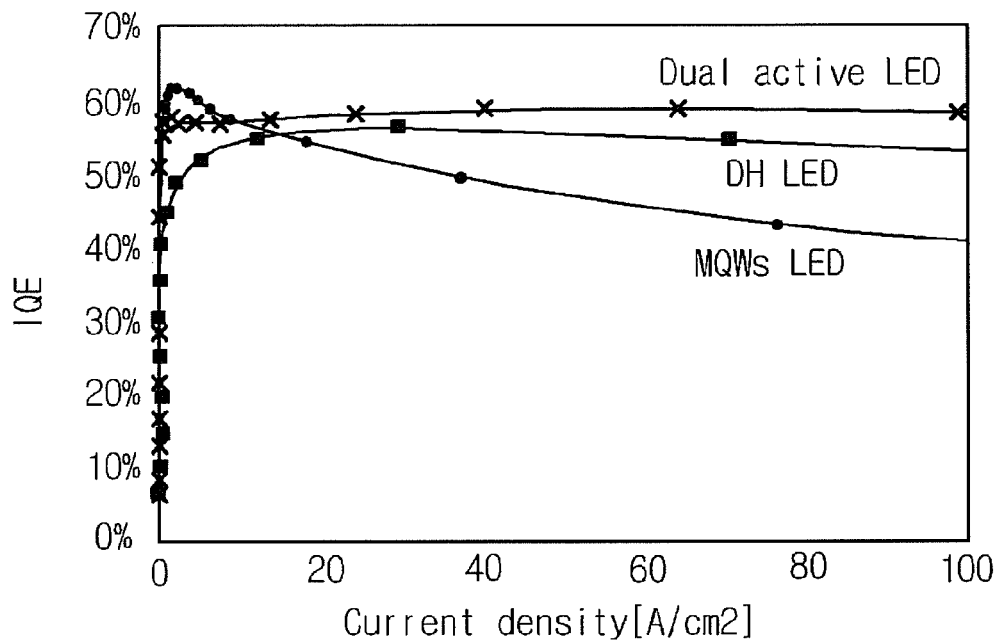
FIG. 14 is a view showing internal light emission quantum efficiency based on an injected current density of a nitride semiconductor blue light emitting device, in a light emitting device according to a fourth embodiment.

FIG. 14 is a view showing internal light emission quantum efficiency based on an injected current density of a nitride semiconductor blue light emitting device having a dual-active layer structure, according to a fourth embodiment. Comparing a light emitting device including only a first active layer MQWs of a multiple-quantum well structure with a light emitting device including only a second active layer DH of a wide single quantum well structure, as shown in FIG. 14, the dual-active light emitting device according to the fourth embodiment relatively provides excellent internal quantum efficiency IQE in a wide injection current region.

(Fifth Embodiment)

Figure 15:
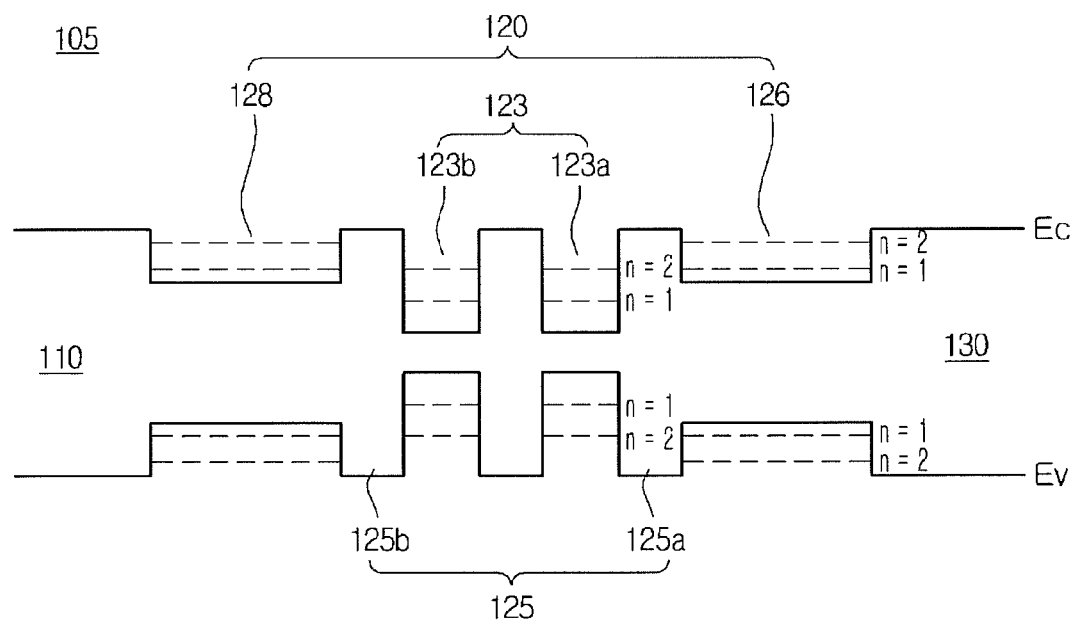
FIG. 15 is a view schematically illustrating an energy band gap of an active layer of a light emitting device having a multiple-active layer which includes one first active layer of a multiple-quantum well structure and two second active layers of a wide single quantum well structure respectively disposed adjacently to an electron injection layer and a hole injection layer, in a light emitting device according to a fifth embodiment.

FIG. 15 is a view schematically illustrating an energy band gap (105) of an active layer of a light emitting device including a multiple active layer, in a light emitting device according to a fifth embodiment.

For example, FIG. 15 is a view schematically illustrating an energy band gap of an active layer of a multiple-active light emitting device where one third active layer 124 has a multiple-quantum well structure (124a, 124b), a fourth active layer 126 adjacent to a hole injection layer has a wide single quantum well structure, and a fifth active 128 adjacent to an electron injection layer has the wide single quantum well structure, according to the third epi structure.

The fifth embodiment may apply the technical characteristics of the fourth embodiment.

In the fifth embodiment, the third active layer 124 having the multiple-quantum well structure is disposed between the fourth and fifth active layers 126 and 128 having the wide single quantum well structure.

In a light emitting device according to the fifth embodiment, the third active layer 124 having the multiple-quantum well structure disposed at a central portion of a multiple active layer mainly participates in light emission, in a low current region, but the fourth and fifth active layers 126 and 128 having the wide single quantum well structure participate in light emission mainly and effectively, in a high current region.

In the fifth embodiment, the gate quantum barrier is disposed between the third and fourth active layers and between the third and fifth active layers as in the embodiments.

In the light emitting device according to the fifth embodiment, a light emitting mechanism in injecting a current operates similarly to the light emitting mechanism that have been described above in the embodiments. The operating mechanism of the light emitting device according to the fifth embodiment will be described below in more detail with reference to FIG. 15.

When a low current is injected, holes injected from the hole injection layer into the active layer pass through the fourth active layer 126, pass over a first gate quantum well barrier 125a, and are injected into a quantum well layer of the third active layer 124.

According to the fifth embodiment, when the size of an energy band gap of the fourth active layer 126 is greater than that of an energy band gap of the quantum well layer in the third active layer 124, hole injection efficiency can be increased.

When a low current is injected, electrons injected from the electron injection layer into the active layer pass through the fifth active layer 128, pass over a second gate quantum well barrier 125b, and are injected into the quantum well layer of the third active layer 124.

According to the fifth embodiment, when the size of an energy band gap of the fifth active layer 128 is greater than that of the energy band gap of the quantum well layer in the third active layer 124, electron injection efficiency can be increased.

As a result, when injecting a low current, electrons and holes are injected into the third active layer 124 disposed at a central portion of the multiple active layer, and combined to emit light, effectively.

When a high current is injected, electrons injected from the electron injection layer into the active layer fill all quantized energy levels in the third active layer 124 disposed at a central portion, and surplus holes pass over the gate quantum barrier 125a and 125b and are effectively injected to the fourth active layer 126 adjacent to the hole injection layer and the fifth active layer 128 adjacent to the electron injection layer.

Therefore, when injecting a high current, the fourth and fifth active layers 126 and 128 mainly participate in light emission by effectively accommodating a number of carriers.

Figure 16:
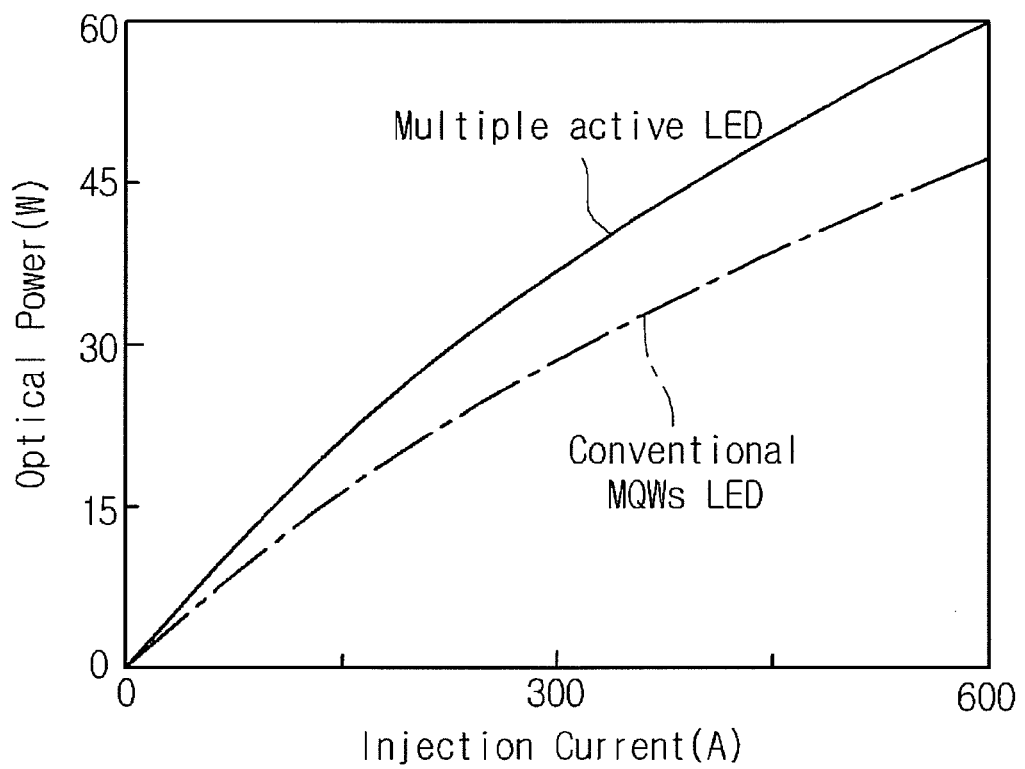
FIG. 16 is a view showing an optical output power of a nitride semiconductor blue light emitting device, in a light emitting device according to a fifth embodiment.

FIG. 16 shows an optical output power for an injected current of a nitride semiconductor blue light emitting device including a multiple active layer, according to a fifth embodiment. FIG. 16 shows that the light emission efficiency of the multiple active layer according to the fifth embodiment is far better than the optical output power of the related art nitride semiconductor blue light emitting device including a single active layer of a multiple-quantum well structure.

Figure 17:
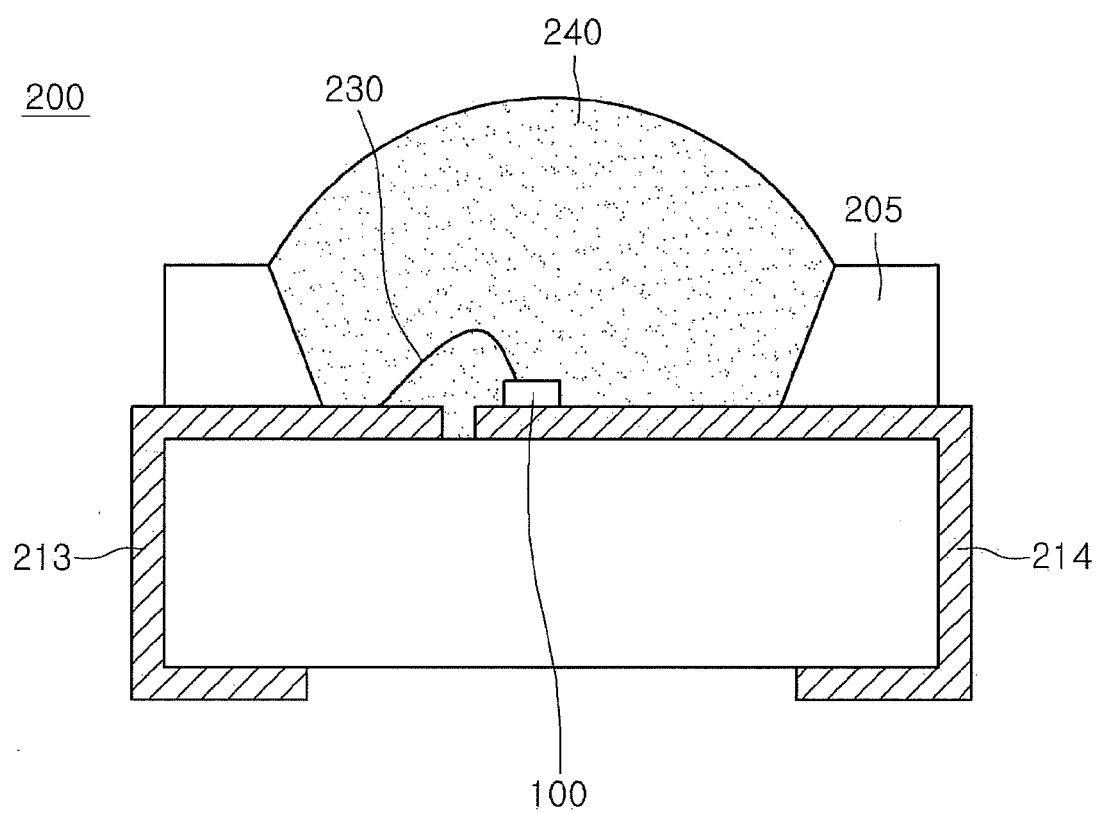
FIG. 17 is a cross sectional view illustrating a light emitting device package according to an embodiment.

FIG. 17 is a cross sectional view illustrating a light emitting device package according to an embodiment.

Referring to FIG. 17, a light emitting device package 200 according to an embodiment includes a package body 205, third and fourth electrode layers 213 and 214 disposed in the package body 205, a light emitting device 100 that is disposed in the package body 205 and electrically connected to the third and fourth electrode layers 213 and 214, and a molding member 240 surrounding the light emitting device 100.

The package body 205 may be formed of a silicon material, a synthetic resin material, or a metal material. An inclined plane may be formed around the light emitting device 100.

The third electrode layer 213 and the fourth electrode layer 214 are electrically separated from each other and supply a power to the light emitting device 100. Also, the third electrode layer 213 and the fourth electrode layer 214 may reflect light emitted from the light emitting device 100 and thus improve light efficiency, and may dissipate heat generated by the light emitting device 100 to the outside.

The light emitting device according to the embodiments may be applied as the light emitting device 100, but the present disclosure is not limited thereto. The light emitting device 100 may apply a horizontal light emitting device, a flip-chip light emitting device, or the like.

The light emitting device 100 may be disposed in the package body 205 or on the third electrode layer 213 or the fourth electrode layer 214.

The light emitting device 100 may be electrically connected to the third electrode layer 213 and/or the fourth electrode layer 214 through a wire 230. In the embodiment, the vertical light emitting device 100 using the one wire 230 is illustrated in the embodiment, but the present disclosure is not limited thereto.

The molding member 240 may surround the light emitting device 100, thereby protecting the light emitting device 100. The molding member 240 may include a phosphor to vary a wavelength of light emitted form the light emitting device 100.

The light emitting device 100 according to an embodiment may be applied to a lighting system. The lighting system may include a lighting unit illustrated in FIG. 18, and a backlight unit illustrated in FIG. 19. The lighting system may include a traffic light, a head light of a vehicle, a sign board, or the like.

Figure 18:
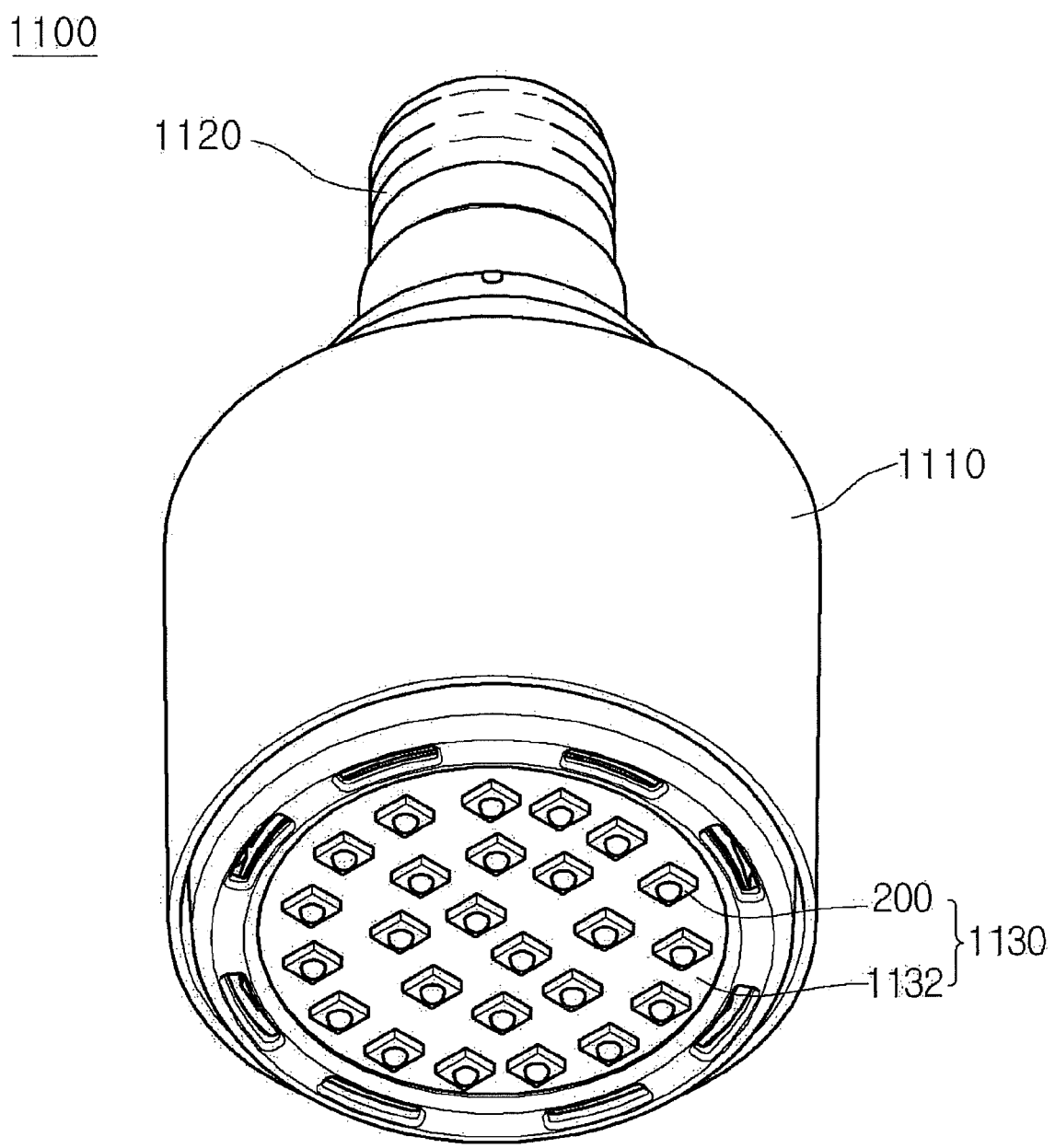
FIG. 18 is a perspective view illustrating a lighting unit according to an embodiment.

FIG. 18 is a perspective view illustrating a lighting unit 1100 according to an embodiment.

Referring to FIG. 18, the lighting unit 1100 may include a case body 1110, a light emitting module 1130 disposed in the case body 1110, and a connection terminal 1120 disposed in the case body 1120 to receive a power from an external power source.

The case body 1110 may be formed of a material having good heat dissipation characteristic. For example, the case body 1210 may be formed of a metal material or resin material.

The light emitting module 1130 may include a substrate 1132 and at least one light emitting device package 200 mounted on the substrate 1132.

The substrate 1132 may be formed by printing a circuit pattern on an insulating material. For example, the substrate 1132 may include a printed circuit board (PCB), a metal core PCB, a flexible PCB, or a ceramic PCB.

Also, the substrate 1132 may be formed of a material that efficiently reflects light, or a surface of the substrate 1132 may be coated in color (for example, white or silver color) that efficiently reflects light.

At least one light emitting device package 200 may be mounted on the substrate 1132. Each light emitting device package 200 may include at least one light emitting diode (LED) 100. The LED 100 may include a colored light emitting device that emits colored light such as red, green, blue, or white light, and an ultraviolet (UV) light emitting device that emits UV light.

As the light emitting device 100, the light emitting device according to the embodiments may be applied.

The light emitting module 1130 may be disposed to have various combinations of the light emitting device package 200 in order to obtain color sense and brightness. For example, a white light emitting device, a red light emitting device, and a green light emitting device may be disposed in combination with each other for securing a high color rendering index (CRI).

The connection terminal 1120 is electrically connected to the light emitting module 1130 to supply a power thereto. Referring to FIG. 18, the connection terminal 1120 is screwed into an external power source in a socket type, but the present disclosure is not limited thereto. For example, the connection terminal 1120 may be formed in a pin type and inserted into the external power source, or be connected to the external power source through a wire.

Figure 19:
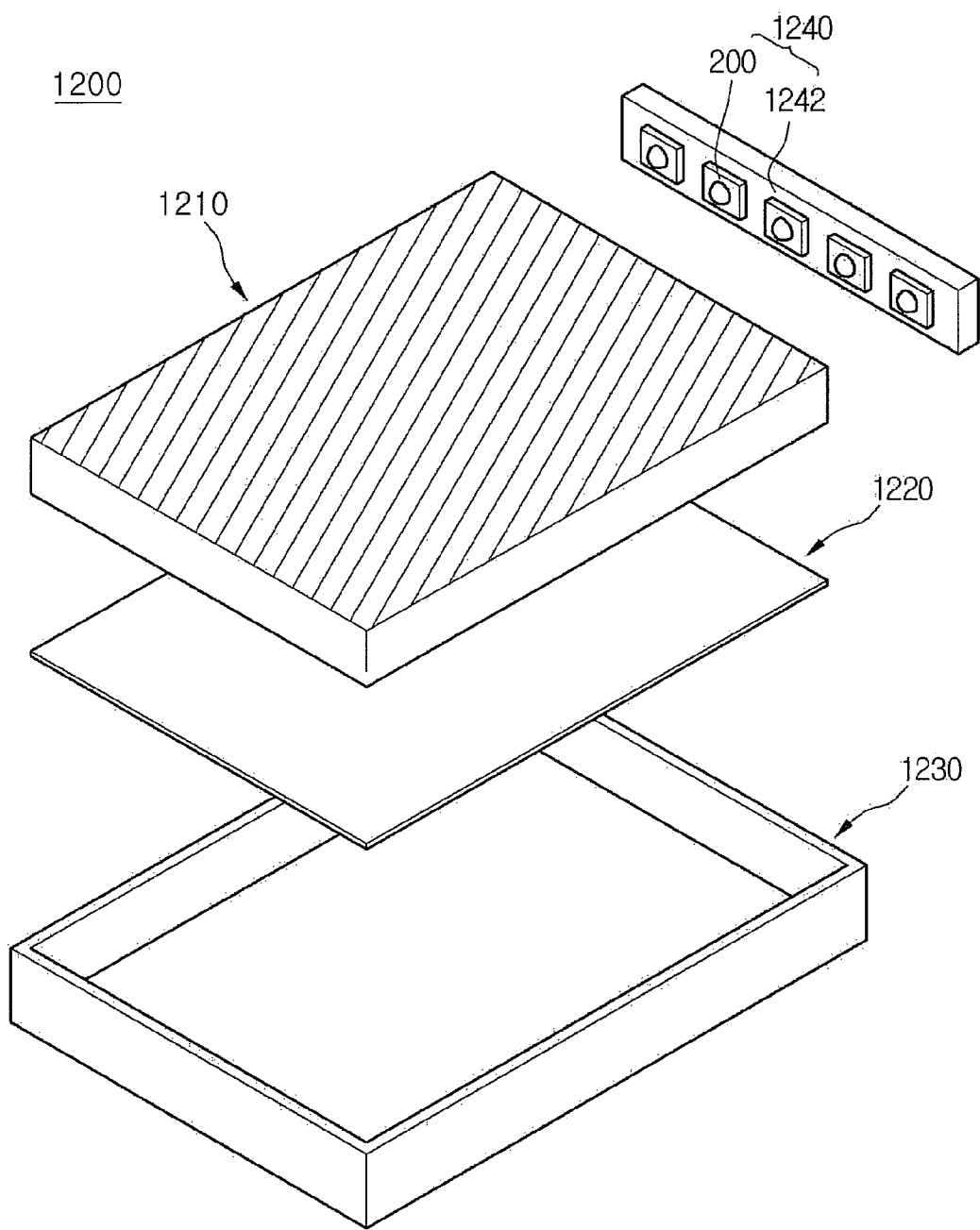
FIG. 19 is a perspective view illustrating a backlight unit according to an embodiment.

FIG. 19 is an exploded perspective view of a backlight unit 1200 according to an embodiment.

The backlight unit 1200 according to an embodiment may include a light guide plate 1210, a light emitting module 1240 supplying light to the light guide plate 1210, a reflective member 1220 under the light guide plate 1210, and a bottom cover 1230 accommodating the light guide plate 1210, light emitting module 1240 and reflective member 1220. However, the present disclosure is not limited thereto.

The light guide plate 1210 allows flat light to be supplied by diffusing light. The light guide plate 1210 may be formed of a transparent material, for example, may include one of acrylic resin such as polymethyl metaacrylate (PMMA), polyethylene terephthalate (PET), poly carbonate (PC), and polyethylene naphthalate (PEN) resin.

The light emitting module 1240 supplies light to at least one side of the light guide plate 1210, namely, serves as a light source of a display device including the backlight unit 1200.

The light emitting module 1240 may contact the light guide plate 1210, but the present disclosure is not limited thereto. Specifically, the light emitting module 1240 may include a substrate 1242 and a plurality of light emitting device packages 200 mounted on the substrate 1242. The substrate 1242 may contact the light guide plate 1210. However, the present disclosure is not limited thereto.

The substrate 1242 may be a PCB including a circuit pattern (not shown). The substrate 1242 may include a typical PCB, a metal core PCB, a flexible PCB, or the like, but the present disclosure is not limited thereto.

The light emitting device packages 200 may be mounted on the substrate 1242 such that a light emitting surface emitting light is separated by a certain distance from the light guide plate 1210.

The reflective member 1220 may be disposed under the light guide plate 1210. The reflective sheet 1220 upwardly reflects light incident on a bottom of the light guide plate 1210, thereby improving the brightness of the backlight unit 1200. For example, the reflective member 1220 may be formed of PET, PC, or PVS resin, but the present disclosure is not limited thereto.

The bottom cover 1230 may receive the light guide plate 1210, the light emitting module 1240, and the reflective member 1220. For this, the bottom cover 1230 may be formed in a box shape with opened top, but the present disclosure is not limited thereto.

The bottom cover 1230 may be formed of a metal material or a resin material, and manufactured through a process such as press molding or extrusion molding. Embodiments provide the light emitting device, the light emitting device package, and the lighting system, which innovatively solve nonradiative loss occurring in injecting a high current and nonradiative loss due to a crystal defect occurring in injecting a low current, which are the fundamental limitations of the related art nitride semiconductor light emitting devices, thereby realizing high efficient light emission characteristics in all injection current regions.

According to the embodiments, fields for applying the nitride semiconductor light emitting device can be considerably increased.

According to the embodiments, the present disclosure can contribute to the development of smart lighting products where an operating injection current varies in regions ranging from the low current region to the high current region.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
a first conductive type semiconductor layer;
a second conductive type semiconductor layer;
an active layer between the first conductive type semiconductor layer and the second conductive type semiconductor layer, wherein the active layer comprises a first active layer and a second active layer adjacent to the first active layer; and
a gate quantum barrier between the first active layer and the second active layer,
wherein a quantum-mechanically quantized density of state of the second active layer is greater than that of the first active layer, and
wherein, when a first level of current is applied, the gate quantum barrier confines a hole, which is injected into the first active layer through the second conductive type semiconductor layer, preventing transport to the second active layer, and
when a second level of current that is higher than the first level of current is applied, the gate quantum barrier allows the hole, which is injected into the first active layer through the second conductive type semiconductor layer, to be drift-transported to the second active layer.

2. The light emitting device according to claim 1, wherein at least one of a color or a wavelength of light emitted from the first active layer and light emitted from the second active layer is the same.

3. The light emitting device according to claim 1, wherein the second active layer comprises a super lattice structure, and the first active layer comprises a single quantum well structure.

4. The light emitting device according to claim 1, wherein the second active layer comprises a multiple-quantum well and a multiple-quantum barrier structure, and a quantum barrier in the second active layer provides for quantum-mechanical tunneling of a carrier.

5. The light emitting device according to claim 1, wherein the first conductive type semiconductor layer is an electron injection layer, the second conductive type semiconductor layer is a hole injection layer, and a size of an energy band gap of the first active layer is greater than or equal to an energy band gap of the second active layer.

6. The light emitting device according to claim 1, wherein the first level of current is less than or equal to about 5 A/cm$^2$, and the second level of current is greater than or equal to about 35 A/cm$^2$.

7. The light emitting device according to claim 1, wherein a size of an energy band gap of the gate quantum barrier is greater than a size of an energy band gap of a quantum well in the first active layer, and is less than or equal to a size of an energy band gap of the second conductive type semiconductor layer.

8. The light emitting device according to claim 1, wherein the first active layer comprises a quantum well structure having a first width, and the second active layer comprises a single quantum well structure having a second width, the first width being narrower than the second width.

9. The light emitting device according to claim 8, wherein a thickness of the first active layer is about 1 nm to about 10 nm, and a thickness of the second active layer is about 3 nm to about 300 nm.

10. The light emitting device according to claim 8, wherein the first conductive type semiconductor layer is an electron injection layer, the second conductive type semiconductor layer is a hole injection layer, and a size of an energy band gap of the second active layer is greater than or equal to a size of an energy band gap of the first active layer.

11. A light emitting device, comprising:
a first conductive type semiconductor layer;
a second conductive type semiconductor layer;
an active layer between the first conductive type semiconductor layer and the second conductive type semiconductor layer wherein the active layer comprises a first active layer having a multiple-quantum well structure and a second active layer adjacent to the first active layer and having a single quantum well structure; and
a gate quantum barrier between the first and second active layers,
wherein a quantum-mechanically quantized density of state of the first active layer is greater than that of the second active layer, and
wherein, when a first level of current is applied, the gate quantum barrier confines a hole, which is injected into the first active layer through the second conductive type semiconductor layer, preventing transport to the second active layer, and
when a second level of current that is higher than the first level of current is applied, the gate quantum barrier allows the hole, which is injected into the first active layer through the second conductive type semiconductor layer, to be drift-transported to the second active layer.

12. The light emitting device according to claim 11, wherein the first conductive type semiconductor layer is an electron injection layer, the second conductive type semiconductor layer is a hole injection layer, and a size of an energy band gap of the second active layer is greater than a size of an energy band gap of the first active layer.

13. The light emitting device according to claim 11, wherein the first active layer comprises a quantum well structure having a first width, and the second active layer comprises a single quantum well structure having a second width, the first width being less than the second width.

14. The light emitting device according to claim 11, further comprising a third active layer disposed between the first conductive type semiconductor layer and the first active layer.

15. The light emitting device according to claim 14, wherein at least one of a color or a wavelength of light emitted from the third active layer or light emitted from a fourth active layer is the same.

16. The light emitting device according to claim 15, wherein at least one of the third active layer or the fourth active layer comprises a super lattice structure.

17. The light emitting device according to claim 14, wherein a quantum barrier of the third active layer is thinner than the gate quantum barrier.

18. The light emitting device according to claim 14, wherein the active layer comprises a well and a barrier, and a width of the gate quantum barrier is greater than a width of the barrier.

19. The light emitting device according to claim 14, wherein the first active layer comprises a first well and a first barrier, wherein the second active layer comprises a second well and a second barrier, and wherein a depth of the first well is substantially same with a depth of the second well.

* * * * *